United States Patent
Wada et al.

(10) Patent No.: US 9,270,008 B2
(45) Date of Patent: Feb. 23, 2016

(54) TRANSMISSION LINE RESONATOR, BANDPASS FILTER USING TRANSMISSION LINE RESONATOR, MULTIPLEXER, BALANCED-TO-UNBALANCED TRANSFORMER, POWER DIVIDER, UNBALANCED-TO-BALANCED TRANSFORMER, FREQUENCY MIXER, AND BALANCE-TYPE FILTER

(75) Inventors: Koji Wada, Tokyo (JP); Morikazu Sagawa, Tokyo (JP); Mitsuo Makimoto, Tokyo (JP)

(73) Assignee: The University of Electro-Communications, Tokyo (JP)

( * ) Notice: Subject to any disclaimer, the term of this patent is extended or adjusted under 35 U.S.C. 154(b) by 264 days.

(21) Appl. No.: 13/982,219

(22) PCT Filed: Jan. 27, 2012

(86) PCT No.: PCT/JP2012/051833
§ 371 (c)(1),
(2), (4) Date: Jul. 26, 2013

(87) PCT Pub. No.: WO2012/102385
PCT Pub. Date: Aug. 2, 2012

(65) Prior Publication Data
US 2013/0307640 A1    Nov. 21, 2013

(30) Foreign Application Priority Data
Jan. 28, 2011  (JP) ................ 2011-016812

(51) Int. Cl.
*H01P 7/08* (2006.01)
*H01P 1/203* (2006.01)
(Continued)

(52) U.S. Cl.
CPC *H01P 7/08* (2013.01); *H01P 1/203* (2013.01); *H01P 1/20381* (2013.01); *H01P 5/10* (2013.01); *H01P 5/12* (2013.01); *H01P 7/082* (2013.01); *H03D 9/0633* (2013.01); *H03H 7/42* (2013.01)

(58) Field of Classification Search
CPC . H01P 1/203; H01P 1/20327; H01P 1/20354; H01P 1/20372; H01P 1/20381; H01P 7/082; H01P 5/10; H01P 5/02

USPC ........ 333/204, 205, 219, 235, 125, 126, 129, 333/136, 4, 134
See application file for complete search history.

(56) References Cited

U.S. PATENT DOCUMENTS 4,578,656 A * 3/1986 Lacour et al. ............... 333/204
4,749,963 A * 6/1988 Makimoto et al. .......... 331/99
(Continued)

FOREIGN PATENT DOCUMENTS

JP    59-121904 U    8/1984
JP    62-120102 A    6/1987
(Continued)

OTHER PUBLICATIONS

Sagawa et al., "Geometrical Structures and Fundamental Characteristics of Microwave Stepped-Impedance Resonators." IEEE Transactions on Microwave Theory and Techniques, vol. 45, No. 7, Jul. 1997, pp. 1078-1085 (8 pages).
(Continued)

*Primary Examiner* — Robert Pascal
*Assistant Examiner* — Gerald Stevens
(74) *Attorney, Agent, or Firm* — Osha Liang LLP

(57) ABSTRACT

A transmission line resonator includes a half-wavelength stepped-impedance resonator with two ends short-circuited to ground, and a capacitive element with one end connected to a center portion of the stepped-impedance resonator and the other end short-circuited to ground. The stepped-impedance resonator includes a first transmission line, a second transmission line, and a third transmission line. The second transmission line has a second line impedance and a second line length, with one end being connected to one end of the first transmission line and the other end being short-circuited to ground. The third transmission line has the second line impedance and the second line length, with one end being connected to the other end of the first transmission line and the other end being short-circuited to ground. The first line impedance is lowered in comparison with the second line impedance.

22 Claims, 20 Drawing Sheets

(51) Int. Cl.
  *H01P 5/10*   (2006.01)
  *H01P 5/12*   (2006.01)
  *H03D 9/06*   (2006.01)
  *H03H 7/42*   (2006.01)

(56) References Cited

U.S. PATENT DOCUMENTS

| | | | | |
|---|---|---|---|---|
| 5,164,690 | A | * | 11/1992 | Yeh et al. ............... 333/204 |
| 5,361,050 | A | | 11/1994 | Einbinder |
| 5,485,131 | A | | 1/1996 | Fajen et al. |
| 6,980,067 | B2 | * | 12/2005 | Forrester et al. ............ 333/133 |
| 2003/0231084 | A1 | * | 12/2003 | Yahata et al. ............... 333/204 |
| 2007/0200650 | A1 | | 8/2007 | Shih |

FOREIGN PATENT DOCUMENTS

| | | |
|---|---|---|
| JP | 6-500442 A | 1/1994 |
| JP | 2002-532916 A | 10/2002 |
| JP | 2010-087830 A | 4/2010 |

OTHER PUBLICATIONS

Makimoto, "Structures and Basic Properties of Microwave SIR." The Institute of Electronics, Information, and Communication Engineers (IEICE), Technical Report of IEICE, MW2003-221, pp. 83-90 (8 pages).

Makimoto et al., "Microwave Resonators and Filters for Wireless Communication." Springer, Heiderberg, Germany, Dec. 2000 (39 pages).

International Search Report issued in PCT/JP2012/051833 mailed on May 1, 2012 (4 pages).

International Preliminary Report on Patentability from PCT/JP2012/051833 mailed on Apr. 16, 2013 (25 pages).

Kitazawa, S. et al.; "Basic Characteristics of Hybrid Resonators for Dual-band BPFs with Two Resonant Frequencies Using a l/2Resonator and a l/4 Resonator"; The Institute of Electronics, Information and Communication Engineers, vol. 106, No. 187, IEICE Technical Report MW2006-51, POE2996-43; Jul. 2006, pp. 85-90 (7 pages).

* cited by examiner

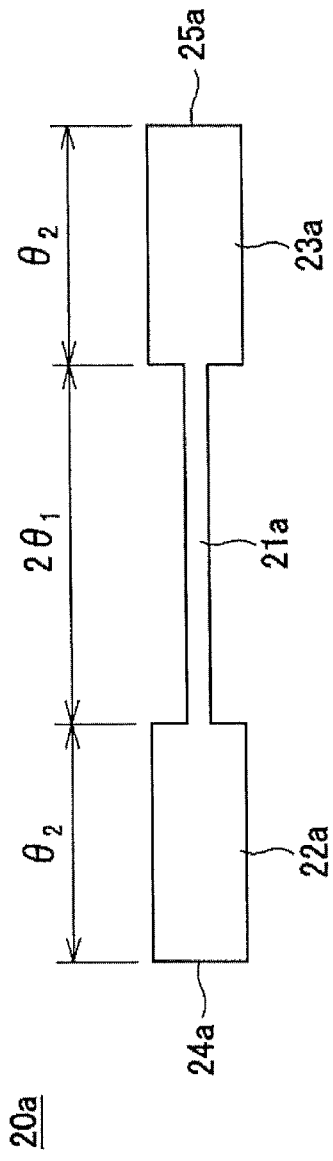
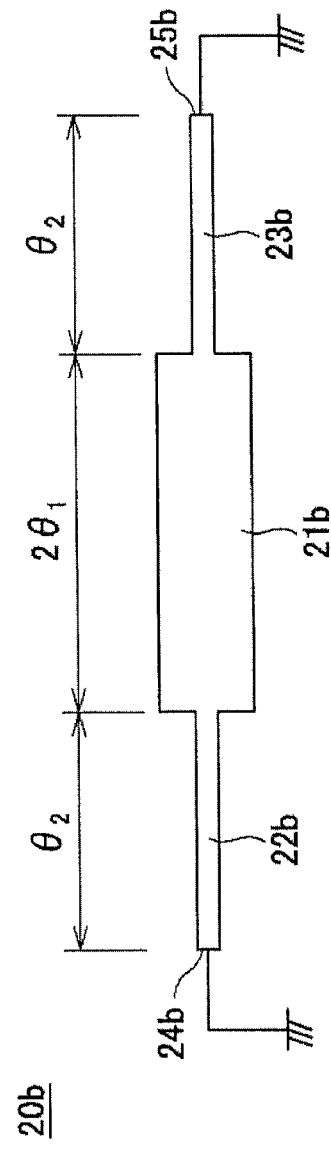
FIG.2A PRIOR ART
FIG.2B PRIOR ART

TRANSMISSION LINE RESONATOR, BANDPASS FILTER USING TRANSMISSION LINE RESONATOR, MULTIPLEXER, BALANCED-TO-UNBALANCED TRANSFORMER, POWER DIVIDER, UNBALANCED-TO-BALANCED TRANSFORMER, FREQUENCY MIXER, AND BALANCE-TYPE FILTER

FIELD OF THE INVENTION

This invention relates to a transmission line resonator for use in high frequency circuits, and in particular concerns a half-wavelength short-ended stepped-impedance transmission line resonator and a bandpass filter, a multiplexer, a balanced-to-unbalanced transformer, a power divider, an unbalanced-to-balanced transformer, a frequency mixer and a balance-type filter using such a transmission line resonator.

The present application asserts priority rights based on JP Patent Application 2011-016812 filed in Japan on Jan. 28, 2011. The total contents of disclosure of the Patent Application of the senior filing date are to be incorporated by reference into the present Application.

BACKGROUND OF THE INVENTION

As resonators for use in high frequency bands and microwave bands, a quarter-wavelength or half-wavelength uniform transmission line resonator has been mainly used. In recent years, as indicated by Non-Patent Document 1, a stepped-impedance resonator (hereinafter, referred to also as "SIR") configured by a plurality of transmission lines having different line impedances has been utilized for the purpose of realizing a small size, spurious suppression or various coupling systems.

The SIR includes various structures. As its typical example, a one-end-opened and the other-end-shorted SIR of a quarter-wavelength type and an open-ended SIR of a half-wavelength type are proposed. As indicated by Non-Patent Documents 2 and 3, since the quarter-wavelength SIR makes it possible to achieve the smallest size, it has been conventionally developed and put into practical use actively. Moreover, in recent years, because of the development of LTCC (Low Temperature Co-fired Ceramics) processing technology, many quarter-wavelength SIR's have been utilized as filters for use in microwave band radio systems as shown in Patent Literature 1.

PRIOR-ART DOCUMENTS

Patent Document

PTL 1: Japanese Patent Application Laid-Open No. 2010-87830

Non-Patent Document

Non-Patent Document 1: Sagawa, Makimoto and Yamashita., "Geometrical Structures and Fundamental Characteristics of Microwave Stepped Impedance Resonators", IEEE Trans. MTT, vol. 45, No. 7, pp. 1078-1085, July 1997

Non-Patent Document 2: Makimoto, "Structures and Characteristics of Microwave SIR", The Institute of Electronics, Information and Communication Engineers (IEICE), IEICE Technical Research Report, MW2003-221, p 83-90, December 2003

Non-Patent Document 3: Makimoto and Yamashita, "Microwave Resonators and Filters for Wireless Communication", Springer, Heiderberg, Germany, December 2000.

SUMMARY OF THE INVENTION

As the half-wavelength SIR, an open-ended structure and a short-ended structure have been known. As indicated by the above-mentioned Non-Patent Documents 2 and 3, in contrast to the open-ended SIR that has been developed in various ways, the short-ended SIR has hardly been put into practical use. The reason for this is mainly because in the case of the open-ended SIR, since it is not necessary to short-circuit a transmission line, a manufacturing process can be easily carried out, and because in contrast to the open-ended SIR that is advantageous in that it is free from floating components and losses that tend to be caused at a short-circuit grounding unit, it is considered that no superiority of the short-ended SIR has been recognized over the open-ended SIR.

However, because of recent developments of a microwave circuit element manufacturing technique, such as an LTCC technique and the like, since a stable short-circuit grounding process in a transmission line can be realized, in order to improve the functions and performances of the half-wavelength SIR having a two-end grounded structure, the inventors or the like of the present invention have reviewed its structure and examined its applications in detail. Therefore, the object of the present invention is to provide a two-end grounded SIR having functions and performances that are equivalent to, or exceed those of an open-ended SIR, and also to provide a high frequency circuit using such an SIR.

As a result of examinations, the inventors or the like of the present invention have found that by loading a capacitive element onto a center portion of a transmission line, the transmission line resonator of the present invention makes it possible to miniaturize its size in comparison with a conventional open-ended SIR. Moreover, by utilizing the symmetry of circuits, a resonator can be easily excited and driven by either of balanced and unbalanced systems, and by adopting various coupling patterns, such as an electric-field coupling, a magnetic-field coupling and the like, a plurality of resonators and external circuits can be coupled with one another.

Moreover, by using combinations of various coupling patterns by the use of the transmission line resonator of the present invention, many kinds of small-size high frequency circuits, such as a filter with multiple stages (bandpass filter), a balanced-to-unbalanced transformer, a power divider, an unbalanced-to-balanced transformer, a frequency mixer and a balance-type filter, may be configured.

More specifically, the transmission line resonator of the present invention is provided with a half-wavelength stepped-impedance resonator with both ends being short-circuited to ground and a capacitive element with one end being connected to a center portion of the stepped-impedance resonator and the other end being short-circuited to ground. Preferably, the stepped-impedance resonator is provided with: a first transmission line having a first line impedance and a first line length; a second transmission line having a second line impedance and a second line length, with one end being connected to one end of the first transmission line and the other end being short-circuited to ground; and a third transmission line having the second line impedance and the second line length, with one end being connected to the other end of the first transmission line and the other end being short-circuited to ground. Moreover, preferably, with respect to the capacitive element, with one end being connected to a center portion of the first transmission line and the other end being short-circuited to ground, it is allowed to satisfy the following formulas:

$$B = \frac{2 \cdot (R_Z - \tan\theta_1 \cdot \tan\theta_2)}{Z_1 \cdot (\tan\theta_2 + R_Z \cdot \tan\theta_1)} \quad \text{[Formula 1]}$$

$$R_Z = \frac{Z_1}{Z_2} \quad \text{[Formula 2]}$$

In this case, jB represents an admittance of the capacitive element, $Z_1$ represents the first line impedance, $2\theta_1$ represents the first line length, $Z_2$ represents the second line impedance, and $\theta_2$ represents the second line length.

The transmission line resonator of the present invention includes a half-wavelength stepped-impedance resonator with both ends being short-circuited to ground, and a capacitive element with one end being connected to a center portion of a stepped-impedance resonator and the other end being short-circuited to ground. Moreover, the first transmission line resonator and the second transmission line resonator of the present invention are disposed to be adjacent to each other with a predetermined clearance, and coupled with each other.

A bandpass filter of the present invention is provided with two or more transmission line resonators having the same resonance frequency, each having a half-wavelength stepped-impedance resonator with both ends short-circuited to ground and a capacitive element with one end connected to a center portion of the stepped-impedance resonator and the other end short-circuited to ground; an input terminal that is electric-field coupled or magnetic-field coupled with one of the transmission line resonators among the two or more transmission line resonators; and an output terminal that is electric-field coupled or magnetic-field coupled with another transmission line resonator that is different from the one transmission line resonator. In this structure, the two or more transmission line resonators are disposed so as to be adjacent to one after another with a predetermined clearance from each other so as to be electric-field coupled or magnetic-field coupled with one after another. Preferably, each of the stepped-impedance resonators is provided with: a first transmission line having a first line impedance and a first line length; a second transmission line having a second line impedance and a second line length, with one end being connected to one end of the first transmission line and the other end being short-circuited to ground; and a third transmission line having the second line impedance and the second line length, with one end being connected to the other end of the first transmission line and the other end being short-circuited to ground.

A multiplexer of the present invention is provided with two or more bandpass filters, each of which is formed by allowing two or more transmission line resonators having the same resonance frequency, each having a half-wavelength stepped-impedance resonator with two ends short-circuited to ground and a capacitive element with one end connected to a center portion of the stepped-impedance resonator and the other end short-circuited to ground, to be disposed so as to be adjacent to each other with a predetermined clearance from each other so as to be electric-field coupled and/or magnetic-field coupled with each other; an input terminal that is formed by allowing respective inputs of the two or more bandpass filters to be electric-field coupled or magnetic-field coupled with each other; and an output terminal that is electric-field coupled or magnetic-field coupled with a transmission line resonator other than the transmission line resonators having the input terminals of the two or more bandpass filters. In this structure, the two or more bandpass filters have respectively different passing bands. Preferably, each stepped-impedance resonator is provided with: a first transmission line having a first line impedance and a first line length; a second transmission line having a second line impedance and a second line length, with one end being connected to one end of the first transmission line and the other end being short-circuited to ground; and a third transmission line having the second line impedance and the second line length, with one end being connected to the other end of the first transmission line and the other end being short-circuited to ground.

A balanced-to-unbalanced transformer of the present invention is provided with: a first transmission line having a first line impedance and a first line length; a second transmission line having a second line impedance and a second line length, with one end being connected to one end of the first transmission line and the other end being short-circuited to ground; a third transmission line having the second line impedance and the second line length, with one end being connected to the other end of the first transmission line and the other end being short-circuited to ground; a capacitive element, with one end being connected to a center portion of the first transmission line and the other end being short-circuited to ground; a first input terminal and a second input terminal that are respectively magnetic-field coupled to a vicinity of a short-circuit grounding unit between the second transmission line and the third transmission line; and an output terminal electric-field coupled to a vicinity of a center portion of the first transmission line, and the first transmission line, the second transmission line and the third transmission line are disposed in a loop shape.

A power divider of the present invention is provided with: a first transmission line having a first line impedance and a first line length; a second transmission line having a second line impedance and a second line length, with one end being connected to one end of the first transmission line and the other end being short-circuited to ground; a third transmission line having the second line impedance and the second line length, with one end being connected to the other end of the first transmission line and the other end being short-circuited to ground; a capacitive element, with one end being connected to a center portion of the first transmission line and the other end being short-circuited to ground; a first input terminal that is electric-field coupled to a vicinity of a center portion of the first transmission line; and a first output terminal and a second output terminal that are respectively magnetic-field coupled to a vicinity of a short-circuit grounding unit between the second transmission line and the third transmission line, and in this structure, the first transmission line, the second transmission line and the third transmission line are disposed in a loop shape.

An unbalanced-to-balanced transformer of the present invention is provided with: a first transmission line having a first line impedance and a first line length; a second transmission line having a second line impedance and a second line length, with one end being connected to one end of the first transmission line and the other end being short-circuited to ground; a third transmission line having the second line impedance and the second line length, with one end being connected to the other end of the first transmission line and the other end being short-circuited to ground; a capacitive element, with one end being connected to a center portion of the first transmission line and the other end being short-circuited to ground; an input terminal that is electric-field coupled to a vicinity of a center portion of the first transmission line; a first phase adjusting unit and a second phase adjusting unit having virtually the same line length, which are disposed so as to be adjacent to each other with a predetermined clearance from each other, respectively in parallel with the second transmission line and the third transmission line; a first output terminal that is magnetic-field coupled to one end of the first phase adjusting unit, which is located at a position farthest from a short-circuit grounding unit of the second transmission line; and a second output terminal that is magnetic-field coupled to one end of the second phase adjusting unit, which is located at a position closest to a short-circuit grounding unit of the third transmission line, and in this structure, the first transmission line, the second transmission line and the third transmission line are disposed in a loop shape, with the other end of each of the first phase adjusting unit and the second phase adjusting unit being short-circuited to ground.

A frequency mixer of the present invention is provided with: a first transmission line having a first line impedance and a first line length; a second transmission line having a second line impedance and a second line length, with one end being connected to one end of the first transmission line and the other end being short-circuited to ground; a third transmission line having the second line impedance and the second line length, with one end being connected to the other end of the first transmission line and the other end being short-circuited to ground; a capacitive element, with one end being connected to a center portion of the first transmission line and the other end being short-circuited to ground; a local oscillation input terminal for use in inputting a local oscillation signal, which is electric-field coupled to a vicinity of a center portion of the first transmission line; a first phase adjusting unit and a second phase adjusting unit having virtually the same line length, which are disposed so as to be adjacent to each other with a predetermined clearance from each other, respectively in parallel with the second transmission line and the third transmission line; a first output terminal that is magnetic-field coupled to one end of the first phase adjusting unit, which is located at a position farthest from a short-circuit grounding unit of the second transmission line; and a second output terminal that is magnetic-field coupled to one end of the second phase adjusting unit, which is located at a position closest to a short-circuit grounding unit of the third transmission line, with the other end of each of the first phase adjusting unit and the second phase adjusting unit being short-circuited to ground, with the first transmission line, the second transmission line and the third transmission line being disposed in a loop shape. Moreover, the frequency mixer of the present invention is further provided with: a high frequency mixing unit having a high frequency signal input unit to which a high frequency signal is inputted and from which a signal that has been subjected to a predetermined filtering treatment is outputted; a first mixing unit input terminal and a second mixing unit input terminal respectively coupled to the first output terminal and the second output terminal of the unbalanced-to-balanced transformer; a third mixing unit input terminal that is coupled to a high frequency signal output terminal of the high frequency signal input unit and a mixing unit output terminal that detects a high frequency signal and a local oscillation signal, and outputs a mixed signal, and an intermediate frequency output unit that has an intermediate frequency input terminal coupled to the mixing unit output terminal, and outputs an intermediate frequency signal after carrying out a predetermined filtering treatment thereon.

A bandpass filter having a balanced input and an unbalanced output of the present invention is provided with: one or more sets of transmission line resonators, each having a first transmission line having a first line impedance and a first line length; a second transmission line having a second line impedance and a second line length, with one end being connected to one end of the first transmission line and the other end being short-circuited to ground; a third transmission line having the second line impedance and the second line length, with one end being connected to the other end of the first transmission line and the other end being short-circuited to ground; and a capacitive element, with one end being connected to a center portion of the first transmission line and the other end being short-circuited to ground, and each set of the transmission line resonators has a structure in which the first transmission line, the second transmission line and the third transmission line are formed by disposing the respective first transmission lines of two transmission line resonators disposed in a loop shape, so as to be adjacent to each other virtually in parallel with each other with a predetermined clearance from each other. Moreover, the plural sets of the transmission line resonators of the bandpass filter having a balanced input and an unbalanced output of the present invention are disposed so as to be adjacent to each other with a predetermined clearance from each other in parallel with each of the second transmission line or the third transmission line, and longitudinally connected to one another successively by magnetic field coupling, and first and second input terminals, which are respectively magnetic-field coupled to a vicinity of a short-circuit grounding unit between the second transmission line and the third transmission line of the first transmission line resonator having no set of the adjacent transmission line resonators, are prepared, and an output terminal, which is electric-field coupled to a center portion of the first transmission line of the last transmission line resonator having a second transmission line and a third transmission line that are disposed so as to be adjacent in parallel with each other with a predetermined clearance from each other, so as to be magnetic-field coupled with the second transmission line and the third transmission line of the other transmission line resonator having no set of the adjacent transmission line resonators, is prepared.

A balance-type filter of the present invention is provided with: one or more sets of transmission line resonators, each having a first transmission line having a first line impedance and a first line length; a second transmission line having a second line impedance and a second line length, with one end being connected to one end of the first transmission line and the other end being short-circuited to ground; a third transmission line having the second line impedance and the second line length, with one end being connected to the other end of the first transmission line and the other end being short-circuited to ground; and a capacitive element, with one end being connected to a center portion of the first transmission line and the other end being short-circuited to ground, and each set of the transmission line resonators is formed by disposing respective first transmission lines of two transmission line resonators, with the second and third transmission lines being disposed in a loop shape, so as to be adjacent virtually in parallel with each other with a predetermined clearance from each other. Moreover, in the balance-type filter of the present invention, the plural sets of the transmission line resonators are disposed so as to be adjacent to each other with a predetermined clearance from each other in parallel with each of the second transmission line or the third transmission line, and magnetic-field coupled with each other so as to be longitudinally connected to one another successively, and in this structure, first and second input terminals, which are respectively magnetic-field coupled to a vicinity of a short-circuit grounding unit between the second transmission line and the third transmission line of the first transmission line resonator having no set of the adjacent transmission line resonators, a first phase adjusting unit and a second phase adjusting unit having the virtually the same line length, which are disposed adjacent to each other with a predetermined clearance virtually in parallel with the second transmission line and the third transmission line of the last transmission line resonator having no set of the adjacent transmission line resonators, and a first output terminal that is magnetic-field coupled to one of ends of the first phase adjusting unit located at a position farthest from a short-circuit grounding unit of the second transmission line and a second output terminal that is magnetic-field coupled to one of ends of the second phase adjusting unit located at a position closest to a short-circuit grounding unit of the third transmission line are prepared.

Effects of Invention

In accordance with a transmission line resonator of the present invention, by loading a capacitive element, the SIR can be made smaller than a conventional open-ended SIR.

In accordance with the transmission line resonator of the present invention, by utilizing its symmetrical structure, a balanced coupling can be easily realized so that balanced input/output processes can be achieved.

In accordance with the transmission line resonator of the present invention, depending on portions of an external circuit and a transmission line resonator to be made close to each other, an electric-field coupling and/or a magnetic-field coupling can be carried out so that various coupled circuits can be realized.

By using the transmission line resonator of the present invention, many kinds of small-size high frequency circuits, such as a bandpass filter with multiple stages, a balanced-to-unbalanced transformer, a power divider, an unbalanced-to-balanced transformer, a frequency mixer, a balance-type filter and the like, can be realized.

BRIEF DESCRIPTION OF DRAWINGS

FIG. 1A is a plan view and FIG. 1B is a cross-sectional view taken along A-A' line that is a symmetrical line of FIG. 1A.

FIGS. 2A and 2B are views showing a structure of a conventional half-wavelength stepped impedance transmission line resonator in which a first transmission line has a line length of $2\theta_1$ and second and third transmission lines have a line length of $\theta_2$; FIG. 2A shows an open-ended resonator, and FIG. 2B shows a short-ended resonator.

FIG. 3A is a view that shows a most simplified structure of the transmission line resonator of the present invention, and FIG. 3B is a view showing a state in which the right half of FIG. 3A is replaced by a capacitor in an equivalent manner by utilizing circuit symmetry.

FIG. 4A is a view showing a designing example of the transmission line resonator of the present invention, and FIG. 4B is a view showing a designed example of a transmission line resonator which is formed by a uniform line for use in comparison with sizes.

FIG. 5A is a view that shows a structure in which first transmission lines are mutually made adjacent in parallel with each other and magnetic-field coupled with each other, FIG. 5B is a view that shows a structure in which second and third transmission lines are mutually made adjacent in parallel with each other and electric-field coupled, FIG. 5C is a view that shows a structure in which virtually center portions of line lengths from the center portion of the first transmission line to a short-circuit grounding unit of the second or third transmission line are made adjacent in parallel with one another, and coupled with one another in a mixed manner with an electric field coupling and a magnetic field coupling, and FIG. 5D is a view that shows a structure in which by rotating one of the transmission line resonators of FIG. 5C by 180° and corresponding lines are coupled with each other in a mixed manner with an electric field coupling and a magnetic field coupling.

FIG. 6A represents an inter-digital capacitor, FIG. 6B represents a stub having a rectangular shape; FIG. 6C represents a stub having a stepped impedance, FIG. 6D represents a T-type stub, and FIG. 6E represents a stub having a folded line structure.

DETAILED DESCRIPTION OF THE INVENTION

Referring to Figs., the following description will discuss a transmission line resonator (hereinafter, referred to simply as a resonator or SIR) as well as a bandpass filter, a multiplexer, a balanced-to-unbalanced transformer, a power divider, an unbalanced-to-balanced transformer, a frequency mixer and a balance-type filter, which use such a transmission line resonator. Additionally, the explanation will be given in the following order.

Figure 1A:
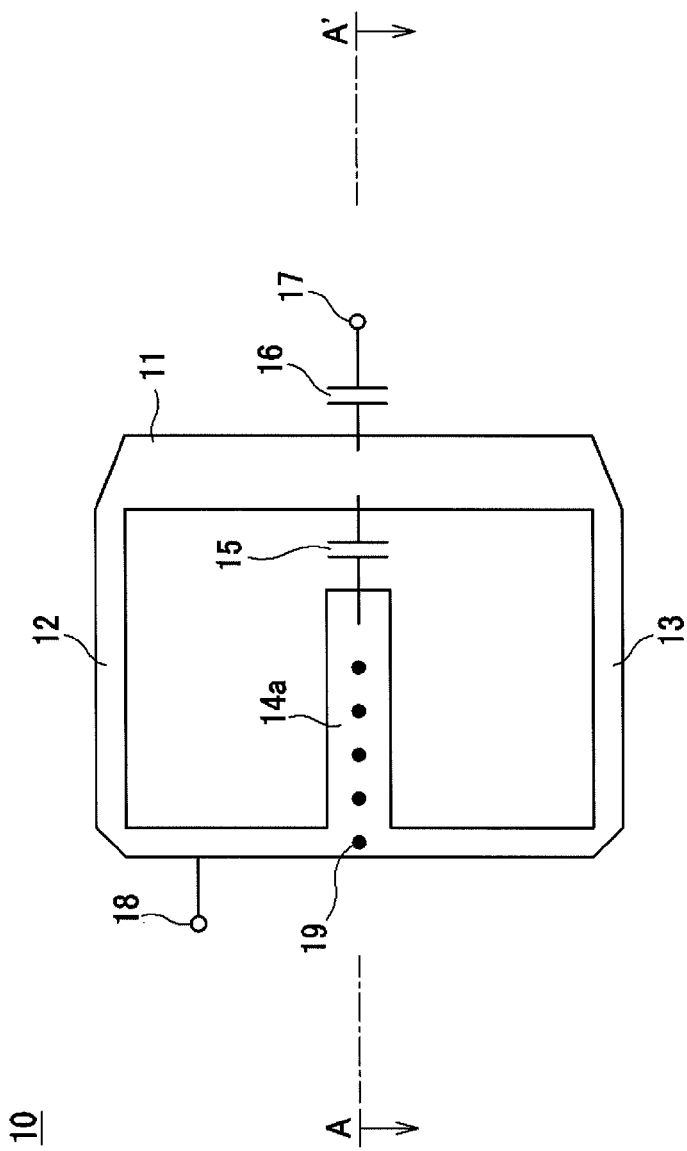
FIGS. 1A and 1B are views showing a structure of a transmission line resonator in accordance with the present invention.
Figure 1B:
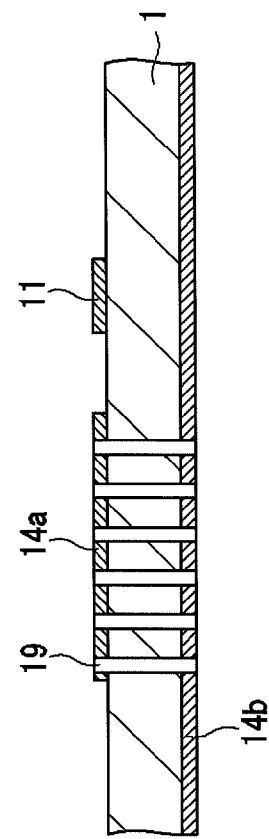

1. Transmission Line Resonator
1-1. Configuration of the transmission line resonator
1-2. Operation principles of the transmission line resonator
1-3. Designed example of the transmission line resonator
1-4. Coupling of the transmission line resonator
(1) Mutual coupling between transmission line resonators
(2) Coupling with an external circuit
1-5. Modified example of the transmission line resonator
2. Application circuit of the transmission line resonator
2-1. Bandpass filter
2-2. Multiplexer
2-3. Balanced-to-unbalanced transformer, power divider, unbalanced-to-balanced transformer
(1) Balanced-to-unbalanced transformer, power divider
(2) Unbalanced-to-balanced transformer
2-4. Frequency mixer
(1) Single balanced mixer
(2) Double balanced mixer
2-5. Balance-type filter
1. Transmission Line Resonator
1-1. Configuration of Transmission Line Resonator As shown in FIG. 1, an SIR 10 of the present invention is formed on a dielectric substrate 1. FIG. 1A is a plan view that shows a patterned surface. Moreover, FIG. 1B is an A-A' line cross-sectional view of FIG. 1A. Normally, the SIR 10 is designed and formed so as to have a line symmetrical shape with the A-A' line serving as a symmetrical line. The SIR 10 has an arrangement in which a first transmission line 11 having a first line impedance $Z_1$ and a first line length $\theta_1$ is provided and a second transmission line 12 is connected to one of ends of the first transmission line 11 in a direction virtually at a right angle with the longitudinal direction of the first transmission line 11, with a third transmission line 13 being connected to the other end of the first transmission line 11 in a direction virtually at a right angle with the longitudinal direction of the first transmission line 11. The second transmission line 12 and the third transmission line 13 have a second line impedance $Z_2$ and a second line length $\theta_2$. The second and third transmission lines 12 and 13 are formed into a "U" letter shape, with the second transmission line 12 and the third transmission line 13 being connected with each other by a short-circuit grounding unit 14a at the end on a side opposite to the side connected to the first transmission line 11 so as to be electrically short-circuited. In the short-circuit grounding unit 14a, the second and third transmission lines 12 and 13 are connected to a short-circuit grounding unit 14b formed on a surface on the rear surface side of the dielectric substrate 1 through via holes 19 indicated by black dots in the Fig. By using this structure, a short-circuit grounding process with a low impedance can be realized.

To virtually the center portion of the first transmission line 11 of the SIR 10, one of the terminals of a capacitive element 15 is connected, and the other terminal is connected to the short-circuit grounding unit 14a. Normally, as shown in FIG. 1A, since the transmission line 11 is made line-symmetrical with the A-A' line, the connection position of the capacitive element 15 in the first transmission line 11 is set to the middle position in the physical dimension in the longitudinal direction of the first transmission line 11, that is, at a position of ½ of the length of the first transmission line 11. However, in the case when, for example, it is made asymmetrical with the A-A' line due to deviations or the like in production, in general, the capacitive element 15 is connected to a position where the electric field intensity of the first transmission line 11 is maximized.

An input terminal 18 is connected to the second transmission line 12 by a tapping coupling process that is one kind of a magnetic field coupling process, which will be described later. An output terminal 17 is connected to the first transmission line 11 by a capacitive coupling process that is one kind of an electric field coupling process, by using a coupling capacitor 16, which will be described later.

In this case, since the second transmission line 12 and the third transmission line 13 are connected to each other on a pattern of the short-circuit grounding unit 14a so as to be electrically connected to each other, the SIR 10 has a closed rectangular loop shape. However, as long as the short-circuit grounding at a low impedance is realized by the short-circuit grounding units 14a and 14b, it is not necessarily required to have the closed loop shape, and a loop shape with one portion being opened may also be used.

1-2. Operation Principles of the Transmission Line Resonator

Referring to FIGS. 2 and 3, the following description will discuss operation principles of the transmission line resonator of the present invention.

FIGS. 2A and 2B are views that show an example of a conventional half-wavelength stepped-impedance resonator. FIG. 2A shows an open-ended stepped-impedance resonator 20a, and FIG. 2B shows a short-ended stepped-impedance resonator 20b.

The open-ended stepped-impedance resonator 20a has a structure in which second and third transmission lines 22a and 23a are respectively connected to two ends of a first transmission line 21a. Nothing is connected to each of open ends 24a and 25a corresponding to the other ends of the second and third transmission lines 22a and 23a so that these ends are kept in an open state.

On the other hand, the short-ended stepped-impedance resonator 20b has a structure in which second and third transmission lines 22b and 23b are respectively connected to two ends of a first transmission line 21b. Each of grounding ends 24b and 25b corresponding to the other ends of the second and third transmission lines 22b and 23b is grounded. In this case, supposing that the line impedance of the first transmission line 21b is $Z_1$ and the line length thereof is $\theta_1$ and that the line impedance of the second and third transmission lines 22b and 23b is $Z_2$ and the line length thereof is $\theta_2$, resonance conditions of the short-ended stepped-impedance resonator 20b are indicated by the following formula:

$$\tan\theta_1 \cdot \tan\theta_2 = \frac{Z_1}{Z_2} \quad \text{[Formula 3]}$$

Figure 3A:
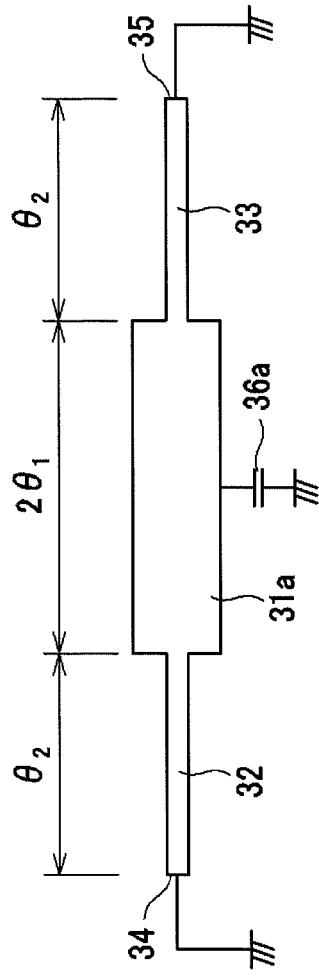
FIGS. 3A and 3B are views that explain operation principles of the transmission line resonator.
Figure 3B:
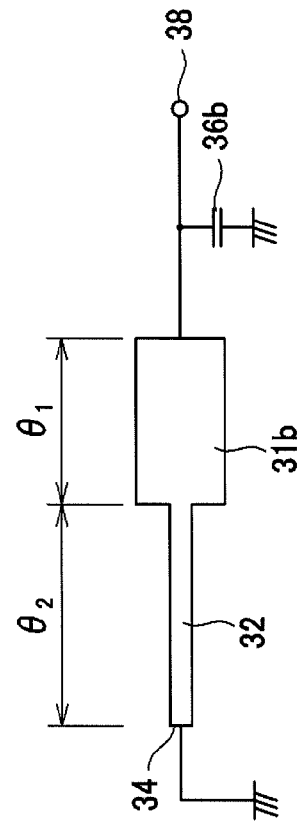

As shown in FIG. 3A, in the same manner as in FIG. 2, a short-ended SIR 30 of the present invention has a structure in which second and third transmission lines 32 and 33 are respectively connected to two ends of a first transmission line 31a. The other ends 34 and 35 of the second and third transmission lines 32 and 33 are grounded. One of the terminals of a capacitive element 36a is connected to a center portion of the first transmission line 31, and the other end of the capacitive element 36a is grounded. Suppose that the line impedance of the first transmission line 31a is $Z_1$ and the line length thereof is $\theta_1$ and that the line impedance of the second and third transmission lines 32 and 33 is $Z_2$ and the line length thereof is $\theta_2$, with a capacitance value of the capacitive element 36a being set to $2C_a$. Since the short-ended SIR 30 of FIG. 3A is formed into a laterally symmetrical structure, with the center of the first transmission line 31a serving as a symmetrical line, this structure is equivalent to a structure in which a capacitive element 36b having a capacitance value Ca is connected to an open end 38 of an SIR with one end opened and with the other end short-circuited, as shown in FIG. 3B. Moreover, since $\theta_a$ can be selected so as to satisfy $\omega C_a \approx (1/Z_1)\tan\theta_a$, the capacitive element 36b of FIG. 3B can be replaced by a transmission line having a line impedance $Z_1$ and a line length $\theta_a$, as shown in FIG. 3C.

Figure 3C:
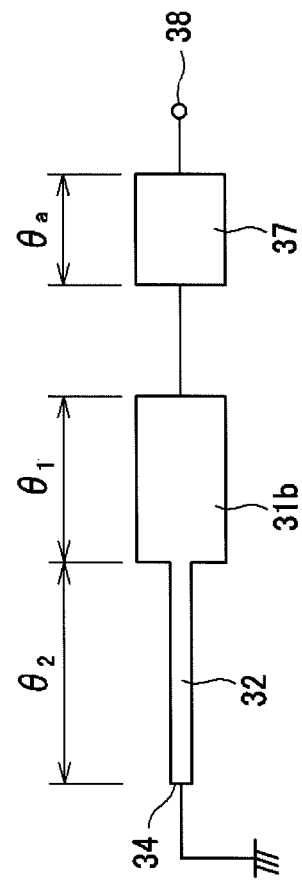
FIG. 3C is a view showing a state in which the capacitor of FIG. 3B is replaced by a transmission line in an equivalent manner.

Therefore, the first transmission line 31b in FIG. 3B may be regarded as one with its line length $\theta_1$ being made longer by $\theta_a$, and the resonance conditions of the SIR shown in FIG. 3C are indicated in the following manner.

$$\tan(\theta_1 + \theta_a) \cdot \tan\theta_2 \simeq \frac{Z_1}{Z_2} \quad \text{[Formula 4]}$$

In this structure, since the loading of the capacitive element 36a having a capacitance $2C_a$ corresponds to making the line length longer, the resonance frequency becomes lower than that in the case when the capacitive element 36a is not loaded. In other words, in order to make the resulting resonance frequency equal to the resonance frequency in the case when the capacitive element 36a is not loaded, it is necessary to make the line length $\theta_1$ of the first transmission line 31 shorter, thereby making it possible to miniaturize the SIR.

In this case, when conditions together with $\omega C_a \approx (1/Z_1)\tan\theta_a$ are generalized, the following resonance conditions need to be satisfied supposing that an admittance of the capacitive element 36a to be loaded is jB.

$$B = \frac{2\cdot(Z_1 - Z_2\cdot\tan\theta_1\cdot\tan\theta_2)}{Z_1\cdot(Z_2\cdot\tan\theta_2 + Z_1\cdot\tan\theta_1)} \quad \text{[Formula 5]}$$
$$= \frac{2\cdot(R_Z - \tan\theta_1\cdot\tan\theta_2)}{Z_1\cdot(\tan\theta_2 + R_Z\cdot\tan\theta_1)}$$

$$R_Z = \frac{Z_1}{Z_2} \quad \text{[Formula 6]}$$

Additionally, in FIG. 3, explanations have been given under conditions that the line impedance $Z_2$ of the second and third lines 32 and 33 is greater than the line impedance $Z_1$ of the first transmission line 31a, that is, under conditions that the width of each of the transmission lines of the second and third transmission lines is narrower than the width of the first transmission line 31a ($R_Z = Z_1/Z_2 < 1$). However, with respect to the structure of SIR, $R_Z > 1$ may be set as long as the above-mentioned resonance conditions are satisfied. By loading a capacitive element, the outer diameter dimension of an SIR can be miniaturized than that of the SIR prior to the loading of the capacitance based upon the above-mentioned operation principle. Moreover, since the line impedance of the second and third transmission lines is lowered, the impedance near the short-circuit grounding unit is consequently reduced so that it is possible to reduce the conductor loss. However, the length (size) of the overall SIR becomes longer than that of a conventional half-wavelength uniform line resonator.

In this case, in FIG. 3A, the position at which the capacitive element 36a is coupled to the first transmission line 31a is normally set to a physical center portion (position on a symmetrical line); however, it is more accurately set in the center of the intensity distribution of an electric field, that is, at the position having the highest electric field intensity. Therefore, in general, in the SIR of the present invention, the connection position of the capacitive element corresponds to the position having the highest electric field intensity of the first transmission line of the SIR.

1-3. Designed Example of the Transmission Line Resonator

Figures 4A, 4B:
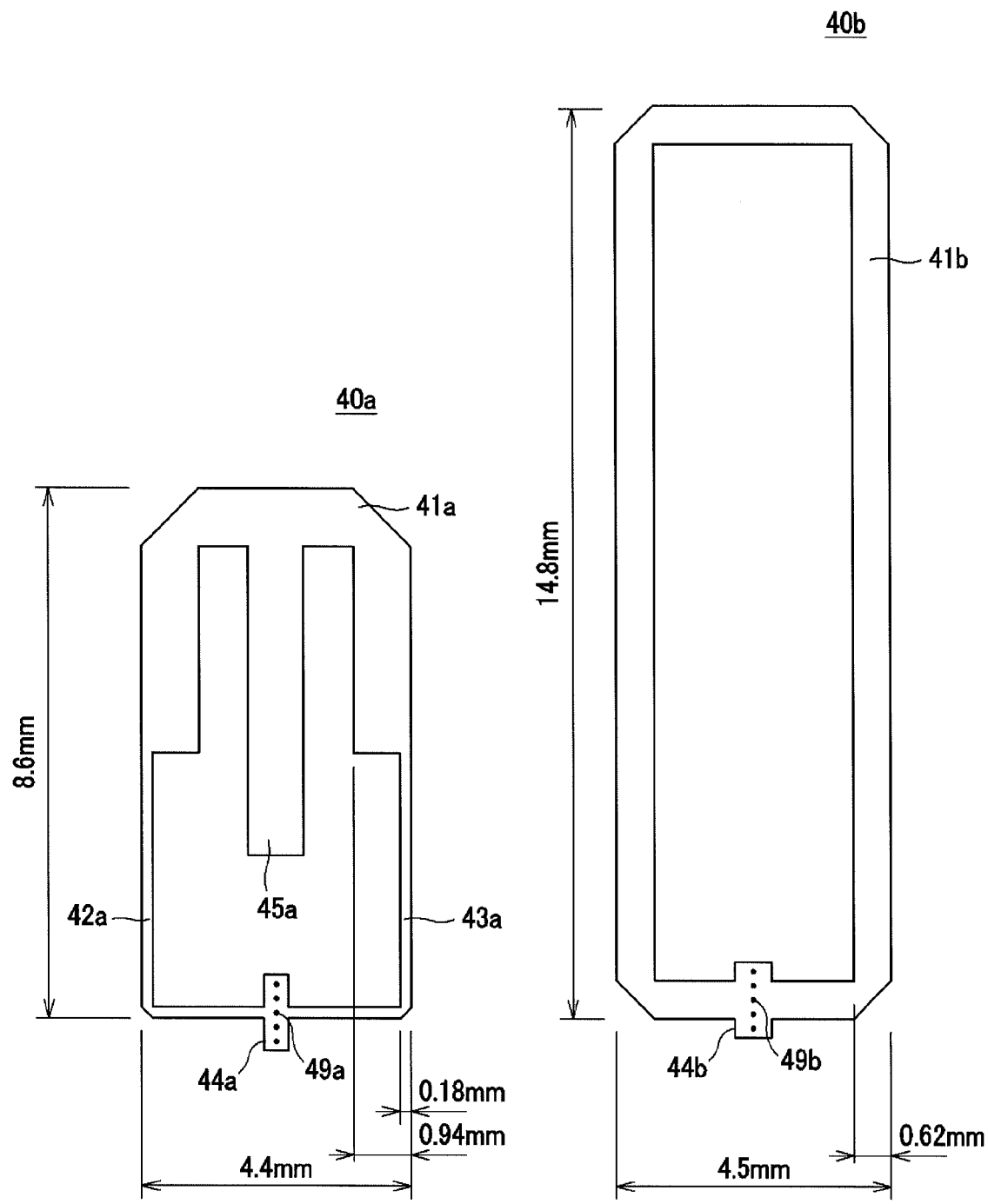
FIGS. 4A and 4B are views showing actual designing examples of the transmission line resonator of the present invention.

FIGS. 4A and 4B show specific designed examples of short-ended SIR 40 in accordance with the present invention. FIG. 4A shows a short-ended SIR 40a of the present invention, and FIG. 4B shows a short-ended uniform line resonator 40b formed into a loop shape, which is shown for use in comparison with sizes.

In each of FIG. 4A and FIG. 4B, a resonator is formed by using micro-strip lines on an alumina substrate (dielectric constant: 9.8) having a thickness of 0.63 mm, and each of them is set to have a resonance frequency of 1.6 GHz. Additionally, the micro-strip lines can be formed on the substrate by using a conventionally known masking technique, etching technique and the like. Moreover, it is needless to say that by using other conventionally known fine processing techniques, an SIR can be formed on an LTCC substrate.

In the short-ended SIR 40a of the present invention shown in FIG. 4A, a first transmission line 41a is formed into a "U"-letter shape with a width of 0.94 mm Second and third transmission lines 42a and 43a, which are linearly connected to the first transmission line 41a, are formed into an L-letter shape, and electrically connected with each other at a short-circuit grounding unit 44a, and further connected to a grounding pattern (not shown) on a rear surface through via holes 49a. The line impedance of the first transmission line 41a is set to 40Ω, and the line impedance of the second and third transmission lines 42a and 43a are set to 80Ω. As will be described later, a stub 45a forms a capacitive element of a distributed constant type. The line impedance of the stub 45a is 40Ω. By changing the stub length of the stub 45a from 0 mm to 8 mm so as to change the capacitance value, the resonance frequency can be changed from 2.0 GHz to 1.5 GHz.

In the short-ended uniform line resonator 40b of FIG. 4B, the uniform line 41b with a width of 0.62 mm has its ends connected with each other by a short-circuit grounding unit 44b, and further connected to a rear surface grounding pattern (not shown) through via holes 49b. The line impedance is set to 50Ω.

As clearly indicated by reference to FIG. 4, while the dimension of the uniform line resonator 40b is 4.5 mm×14.8 mm, the dimension of the short-ended SIR 40a of the present invention is 4.4 mm×8.6 mm, which is miniaturized to about ½. Additionally, in the case when the capacitance to be loaded satisfies formula 5 and formula 6, the size and electrical characteristics, which are optimized relative to the resonance frequency, can be realized as shown in FIG. 4A or as will be described later. On the other hand, it is needless to say that, even in the case when these relationships are not satisfied, miniaturization relative to a conventional resonator can be achieved with superior electrical characteristics being exerted.

1-4. Coupling of the Transmission Line Resonator

Next, the following description will explain how to mutually couple circuits, which forms another feature of the short-ended SIR of the present invention.

(1) Mutual Coupling Between Transmission Line Resonators

FIGS. 5A, 5B, 5C and 5D are drawings that show layout patterns for use in mutually coupling short-ended SIR's of the present invention.

Figure 5A:
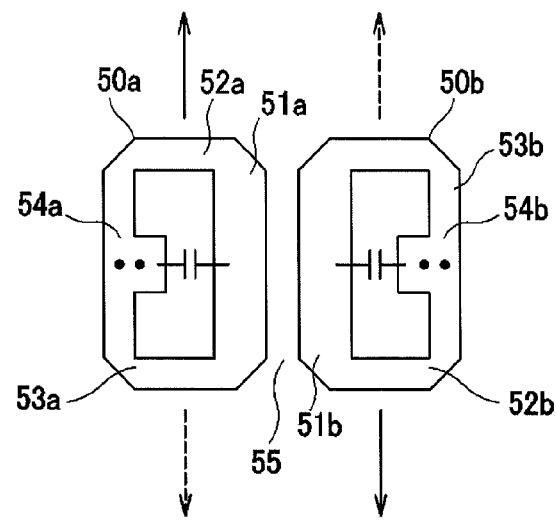
FIGS. 5A to 5D are views that explain coupling patterns of the transmission line resonator of the present invention.

FIG. 5A is a drawing in which a short-ended SIR 50a having first, second and third transmission lines 51a, 52a and 53a that are disposed in a rectangular loop shape and a short-ended SIR 50b having the same shape as the SIR 50a are disposed adjacent to each other so as to be coupled with each other. The first transmission line 51a of the short-ended SIR 50a on the left side of FIG. 5A and the first transmission line 51b of the short-ended SIR 50b on the right side are made face to face virtually in parallel with each other, with a clearance 55 from each other; thus, the short-ended SIR's 50a and 50b are disposed so as to be adjacent to each other. With this arrangement, since an electric field becomes stronger in the clearance 55, the SIR's 50a and 50b are kept in a coupled state in which electric field coupling is predominant. When the right and left short-ended SIR's 50a and 50b are shifted in directions indicated by solid arrows in FIG. 5A, the electric field intensity exerted on the two short-ended SIR's 50a and 50b becomes gradually weaker, with the result that the coupling between the SIR's also becomes weaker. In the same manner, by shifting the right and left short-ended SIR's 50a and 50b in directions indicated by dotted arrows, the degree of coupling can also be adjusted. Of course, when the clearance 55 is made larger, the coupling of the short-ended SIR's 50a and 50b becomes weaker, and when the clearance 55 is made smaller, the coupling thereof becomes stronger.

Figure 5B:
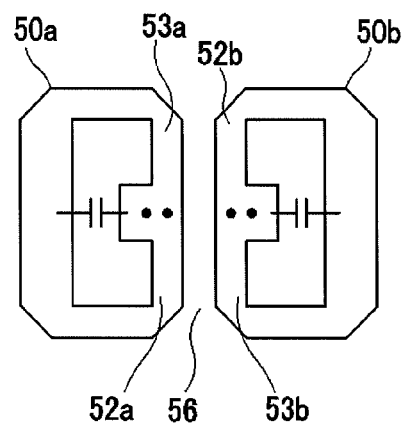

FIG. 5B is a drawing that shows a layout for use in magnetic-field coupling SIR's that are the same as the short-ended SIR's 50a and 50b of FIG. 5A. The second and third transmission lines 52a and 53a of the short-ended SIR 50a on the left side of FIG. 5B and the second and third transmission lines 52b and 53b of the short-ended SIR 50b on the right side are made face to face virtually in parallel with each other and spaced from each other with a clearance 56; thus, the short-ended SIR's 50a and 50b are disposed so as to be adjacent to each other. With this arrangement, since a magnetic field becomes stronger in the clearance 56, the short-ended SIR's 50a and 50b are kept in a coupled state in which magnetic field coupling is predominant. In the same manner as in FIG. 5A, by shifting the right and left short-ended SIR's 50a and 50b longitudinally or laterally, the degree of coupling thereof can be adjusted.

Figure 5C:
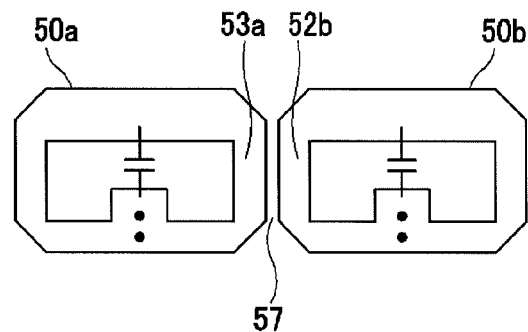

FIG. 5C is a drawing that shows a state in which the third transmission line 53a of the short-ended SIR 50a on the left side and the second transmission line 52b of the short-ended SIR 50b on the right side are made face to face virtually in parallel with each other, with a clearance 57 from each other, so that the short-ended SIR's 50a and 50b are disposed so as to be adjacent to each other. With this arrangement, the two short-ended SIR's 50a and 50b are coupled to each other in a mixed state with the electric field coupling and the magnetic field coupling being exerted.

Figure 5D:
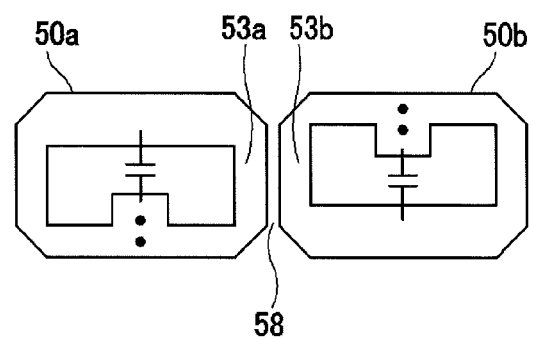

FIG. 5D is a drawing that shows a layout in which the third transmission line 53a of the short-ended SIR 50a on the left side and the third transmission line 53b of the short-ended SIR 50b on the right side are made face to face virtually in parallel with each other, with a clearance 58 from each other; thus, the short-ended SIR's 50a and 50b are disposed so as to be adjacent to each other.

In the cases shown in FIGS. 5C and 5D also, by shifting the right and left short-ended SIR's 50a and 50b longitudinally or laterally, the degree of coupling thereof can be adjusted.

In FIGS. 5A to 5D, explanations have been given by exemplifying the two short-ended SIR's having the same shape; however, the kinds of coupling patterns based upon layout patterns are not intended to be limited by the shapes of SIR's and characteristics of resonance frequencies and the like. Different shapes, for example, one is a square shape as shown in FIG. 1 and the other is a linear shape as shown in FIG. 3, may be used, and both of them having linear shapes may be used. In the short-ended SIR of the present invention, SIR's can be mutually coupled with each other based upon the layout thereof even if they have desired shapes and desired characteristics so that the degree of coupling can be set and adjusted. The kinds of coupling include electric field coupling and magnetic field coupling in a mixed manner, and as it comes closer to the center portion of the first transmission line, the electric field coupling is mainly exerted, while as it comes closer to the short-circuit grounding unit of the second and third transmission lines, the magnetic field coupling is mainly exerted in the coupling state.

In this manner, when mutually coupled with each other, the short-ended SIR's of the present invention make it possible to easily adjust the degree of coupling depending on the layouts and distances thereof, and it becomes possible to carry out a circuit designing under limitation conditions of designing, and consequently to achieve miniaturization of the circuit.

(2) Coupling with an External Circuit

The short-ended SIR of the present invention can be coupled with an external circuit in the same manner as in the case of mutually coupling the SIR's.

As shown in FIG. 1, since the center portion of the first transmission line 11 has a strong electric field, an output can be taken out by an electric field coupling by the coupling capacitor 16, that is, a capacitive coupling thereof. Moreover, in the vicinity of the short-circuit grounding unit 14a of the second transmission line 12, since a magnetic field is strong, it can be connected to an external circuit by a magnetic field coupling by using a tapping coupling.

It is needless to say that regardless of shapes and performances of the SIR 10 of FIG. 1, a short-ended SIR having a desired shape and performances can be easily connected to an external circuit by the use of electric field coupling or magnetic field coupling. Moreover, it is needless to say that upon providing capacitive coupling, not limited to the use of a capacitor that is a lumped constant element, a distributed constant element utilizing a stub to be described later and a variable capacitive element can be utilized.

1-5. Modified Example of the Transmission Line Resonator

FIG. 6 is a drawing that shows an example in which the capacitive element connected in the center portion of the first transmission line of the short-ended SIR of the present invention is utilized as a distributed constant circuit element.

FIG. 6 shows an example of an inter-digital capacitor. The inter-digital capacitor is constituted by disposing comb-shaped electrodes 62 and 63 so as to be spaced apart from each other with a predetermined clearance. One of the electrodes 62 is connected to the short-ended SIR by a connection terminal 61a. The other electrode 63 is connected to a grounding electrode of a lower layer through via holes 64. The capacitance value can be determined by the width, length and number of the "combs" or the clearance between electrodes or the like.

Figure 6A:
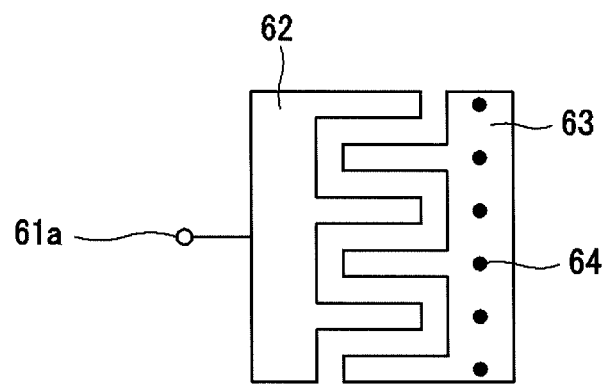
FIGS. 6A to 6E are views that show distribution constant elements that can be used as capacitive elements to be connected to the center portion of the first transmission line of the transmission line resonator of the present invention and as elements for use in capacitive coupling to an external circuit.
Figure 6B:
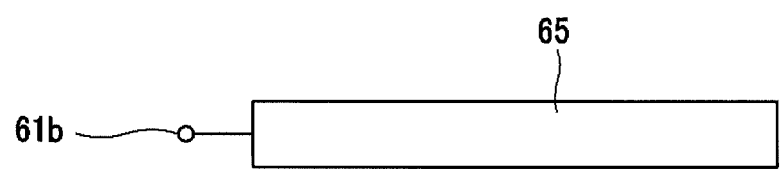

FIG. 6B is a drawing that shows an example of a capacitive stub composed of an open-circuited rectangular transmission line 65. This capacitive stub is connected to an SIR by a connection terminal 61b.

Figure 6C:
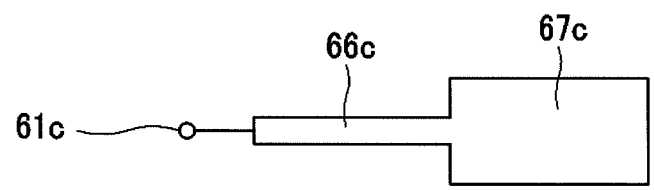

FIG. 6C is a drawing that shows a stepped-impedance stub that uses two transmission lines 66c and 67c so as to miniaturize the capacitive stub as shown in FIG. 6B.

Figure 6D:
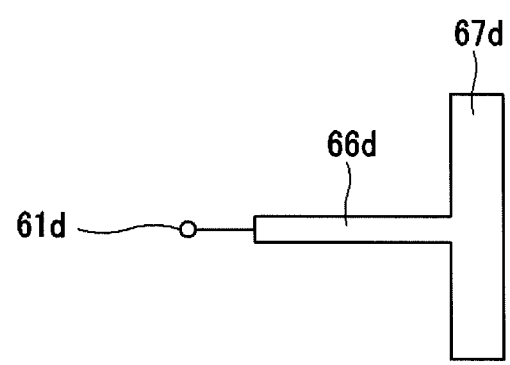

FIG. 6D is a drawing that shows an example of a T-type stub in which the transmission line 67c of an open end portion in FIG. 6C is divided and widened.

Figure 6E:
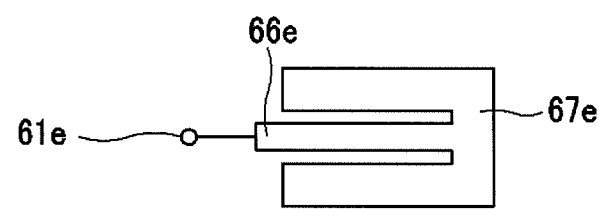

FIG. 6E is a drawing that shows an example of a stub having a folded line structure in which the transmission line of a T-letter shaped portion is bent over so as to further miniaturize the T-type stub of FIG. 6D.

Additionally, it is needless to say that the capacitive element of the distributed constant type shown in each of FIGS. 6A to 6E may be used not only for a capacitive element that is connected to the center portion of the first transmission line of the short-ended SIR of the present invention, but also for a coupling capacitance to be used upon electric-field coupling with an external circuit.

Figure 7:
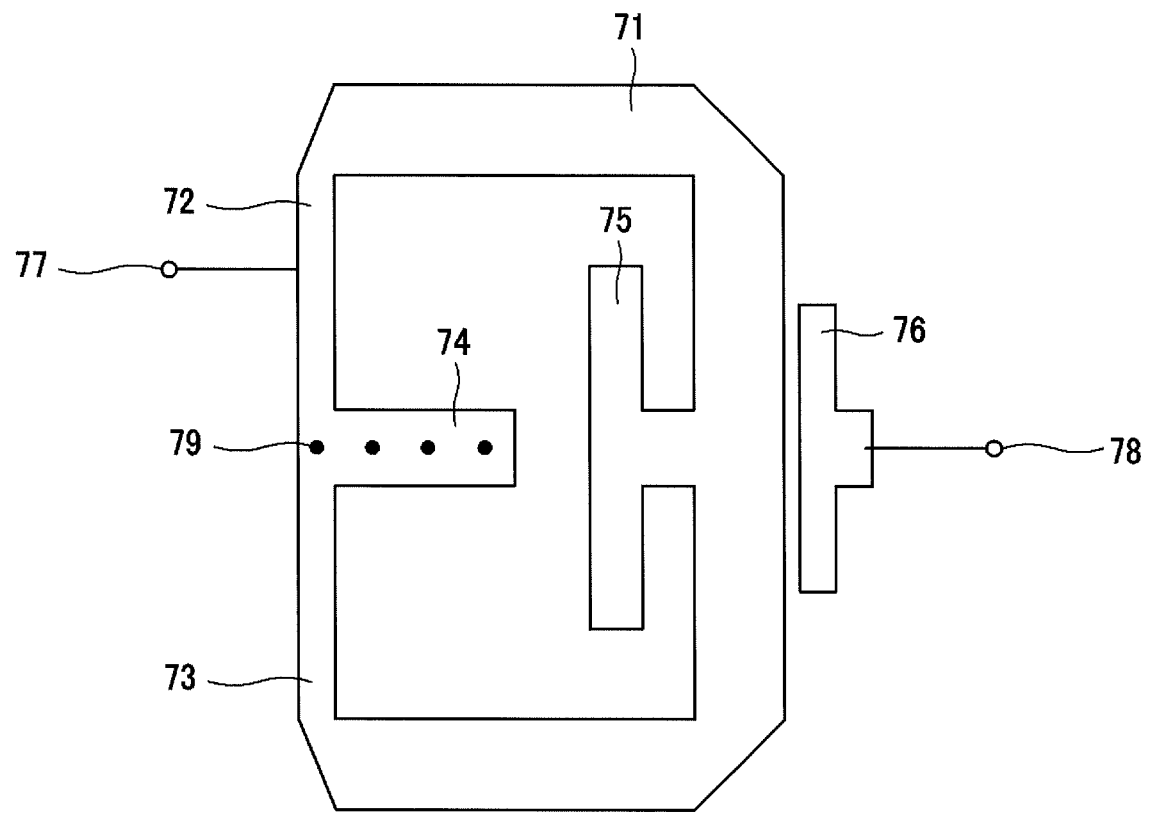
FIG. 7 is a view showing one of modified examples of the transmission line resonator of the present invention, which corresponds to an example in which a T-type stub is used as the capacitive element.

FIG. 7 is a drawing that shows an example in which the T-type stub shown in FIG. 6D is used as a capacitive element 75. In this example, the capacitive element 75 formed by the T-type stub is integrally formed together with a first transmission line 71 in the center portion of the first transmission line 71 of a short-ended SIR 70. Moreover, in order to capacitive couple an output terminal 78 to the short-ended SIR 70, a T-type stub 76 is used. Additionally, an input signal is inputted from an input terminal 77 through a tapping coupling.

In the example shown in FIG. 7, the capacitive element 75 is realized by one T-type stub; however, it may be realized by using a combination of a plurality of stubs, and it is of course possible to use various kinds of stubs shown in FIG. 6.

Figure 8:
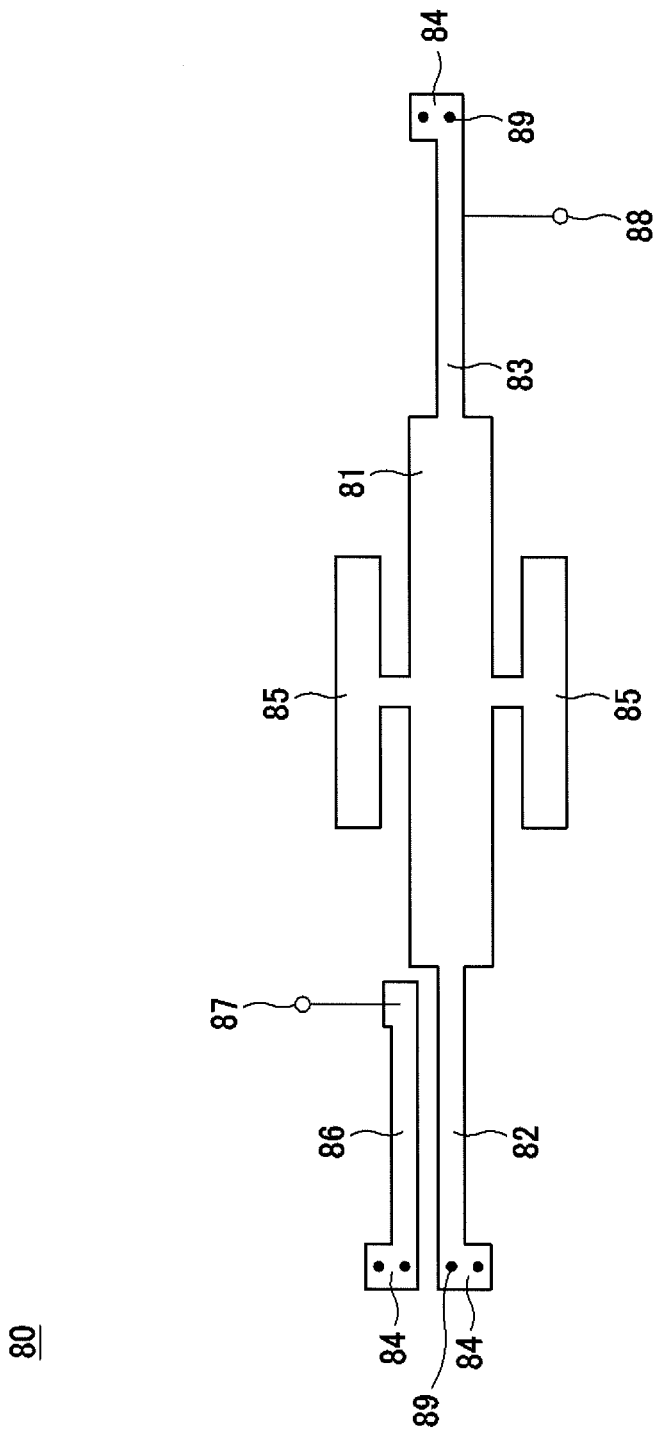
FIG. 8 is a view showing one of modified examples of the transmission line resonator of the present invention, which corresponds to an example in which the first to third transmission lines are disposed linearly, and two T-type stubs are used as capacitive elements, with magnetic field coupling being used for connection with an external circuit.

As shown in FIG. 8, not limited to a closed loop shape, a short-ended SIR 80 in accordance with the present invention may be formed into a linear-shaped structure. Second and third transmission lines 82 and 83 are connected to the two ends in the long side direction of the first transmission line 81. Two capacitive elements 85 are formed in the center portions of the two sides of each side of the first transmission line 81 to which none of the second and third transmission lines 82 and 83 are connected. In this case, since the two capacitive elements 85 are connected in parallel with each other, it is possible to realize a large capacitance value. A parallel coupling unit 86, which is disposed so as to be adjacent to the second transmission line 82 virtually in parallel therewith with a predetermined clearance, is coupled to the second transmission line 82 through magnetic field coupling. An input signal is inputted by an input terminal that is tapping-coupled to the parallel coupling units 86. On the other hand, an output signal is outputted by an output terminal 88 that is tapping-coupled to the vicinity of a short-circuit grounding unit 84 of the third transmission line 83. The short-circuit grounding unit 84 is connected to a rear surface grounding pattern (not shown) through via holes 89.

Figure 9:
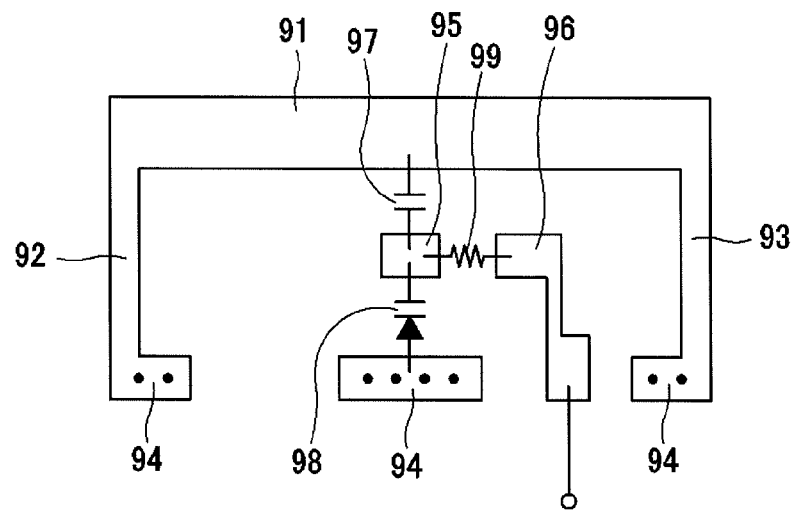
FIG. 9 is a view showing one of modified examples of the transmission line resonator of the present invention, which corresponds to an example in which the second and third transmission lines are connected to end portions of the first transmission line in a direction with a right angle, and disposed in a "U" letter shape. This example shows the application of the resonator as a tuning circuit for variably changing a resonant frequency of the resonator by a variable voltage from an external power supply, by utilizing a variable capacitive diode as the capacitive element.

FIG. 9 is a drawing that shows an example of a short-ended SIR 90 that has rectangular-shaped second and third transmission lines 92 and 93 connected to the two ends of a rectangular-shaped first transmission line 91 so as to respectively make virtually right angles with the first transmission line 91. As shown in FIG. 9, the short-circuit grounding units 94 of the second and third transmission lines 92 and 93 are connected with each other on a pattern surface, and are not required to form a closed loop shape.

As another example, a shape (Z-letter shape) may be formed in which the second and third transmission lines are bent in different directions by 180° so as to be connected to the first transmission line.

In this case, in the example of FIG. 9, a variable tuning diode 98 is used as a capacitive element. As shown in FIG. 9, the variable tuning diode 98 has its anode terminal connected to the short-circuit grounding unit 94 and its cathode terminal connected to the capacitive element 97, with the other terminal of the capacitive element 97 being connected to a center portion of the first transmission line 91. A control electrode 96 is connected to a connection node 95 between the capacitive element 97 and the variable tuning diode 98 via a resistor 99 so that a control voltage is applied to the variable tuning diode 98 from an external power supply. In this applied circuit, since the capacitance value is changed depending on the voltage from the external power supply so as to consequently change the resonance frequency, it can be applicable to an electron tuning filter and a voltage control oscillator.

Additionally, in the case when the line impedance of the first transmission line 91 is made greater than the line impedance of the second and third transmission lines 92 and 93, it becomes possible to design the variable frequency range to be widened in the case of using the same capacitance value and variable tuning diode 98. Moreover, the resistor 99 may be replaced by a high frequency choke coil.

Figure 10:
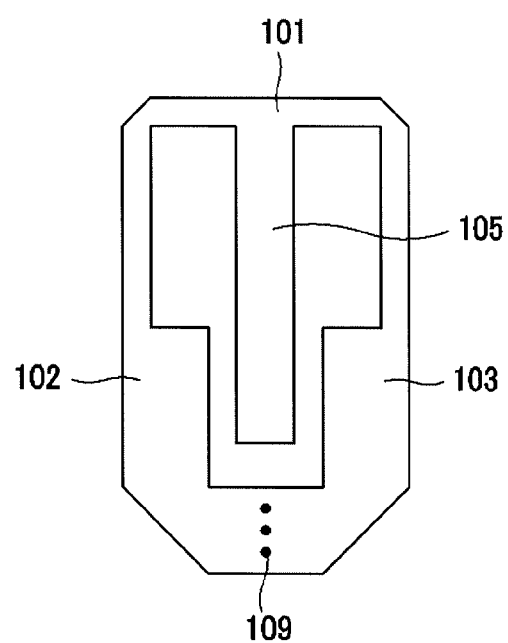
FIG. 10 is a view showing one of modified examples of the transmission line resonator of the present invention, which corresponds to a designed example in which the line impedance of the second and third transmission lines is lowered in comparison with the line impedance of the first transmission line. Moreover, this example uses a stub having a rectangular shape as a capacitive element.

FIG. 10 is a drawing that shows an example of a short-ended SIR 100 having a structure in which the line impedance of a first transmission line 101 is made greater than the line impedance of second and third transmission lines 102 and 103. Although a capacitive element 105 of the short-ended SIR 100 shown in FIG. 10 is prepared as an open-circuited stub, the capacitive element may be another stub as shown in FIG. 5, or may be a capacitor serving as a lumped constant element. Moreover, a variable capacitive element may be used, if necessary.

The short-ended SIR 100 shown in FIG. 10 is not capable of being miniaturized in comparison with the half-wavelength uniform line resonator. However, since the short-ended SIR 100 makes it possible to provide the transmission line including the short-circuit grounding unit as a low impedance line, it becomes possible to reduce a loss that tends to occur in the short-circuit grounding unit, and consequently to design Q at the time of unload of the resonator to have a greater value.

As described above, the short-ended SIR of the present invention makes it possible to miniaturize its size, and also to easily couple an external circuit and SIR's with each other; therefore, it is possible to provide a high frequency circuit having high degree of designing freedom.

2. Application Circuit of the Transmission Line Resonator

Next, the following description will discuss various application circuits in which the short-ended SIR of the present invention is used.

2-1. Bandpass Filter

The bandpass filter is a circuit to which a signal having mixed frequencies is inputted so as to take out a signal having predetermined frequency.

Figure 11:
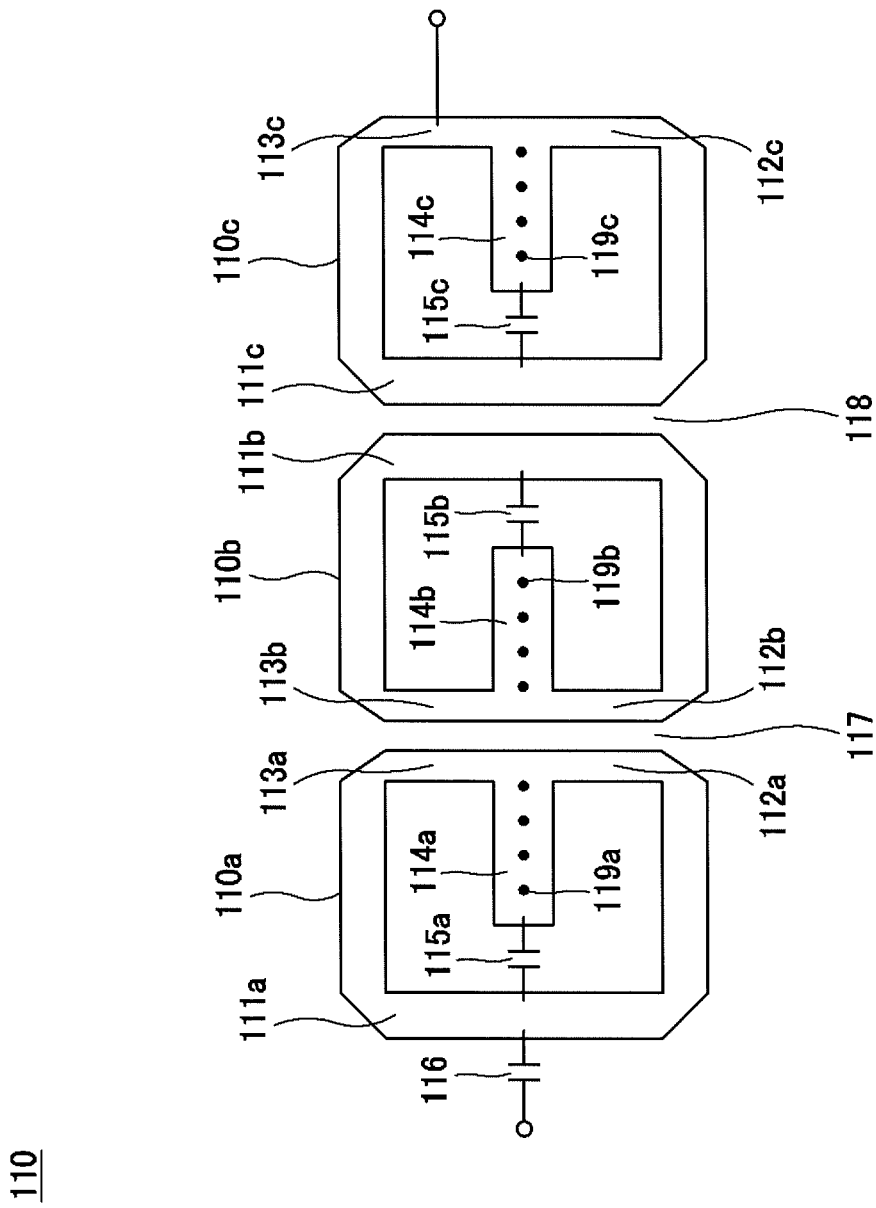
FIG. 11 is a view showing an application example in which a bandpass filter with three stages is configured by using the transmission line resonator of the present invention.

FIG. 11 is a drawing that shows an applied example in which three short-ended SIR's (hereinafter, referred to simply as SIR) of the present invention are used to form a bandpass filter having a structure of three stages.

A first SIR 110a is virtually the same as the SIR shown in FIG. 1. That is, the first SIR 110a has a structure in which a first transmission line 111a having a "U"-letter shape is installed and a second transmission line 112a is connected to one of the ends of the first transmission line 111a virtually in a direction making a right angle with the first transmission line 111a. Moreover, a third transmission line 113a is connected to the other end of the first transmission line virtually in a direction making a right angle with the first transmission line 111a. The second and third transmission lines 112a and 113a have an L-letter shape, and the second and third transmission lines 112a and 113a are connected with each other by a short-circuit grounding unit 114a at an end on the side opposite to the side connected to the first transmission line 111a so as to be electrically short-circuited. In the short-circuit grounding unit 114a, the second and third transmission lines 112a and 113a are connected to a short-circuit grounding unit (not shown) formed on one surface on the rear surface side of a dielectric substrate with the SIR 110a formed thereon, through via holes 119a. Second and third SIR 110b and 110c have the same resonance frequency as that of the first SIR 110a, and also have all the same structure and shape.

Respective second and third transmission lines 112a, 113a, 112b and 113b of the first and second SIR's 110a and 110b are disposed so as to allow the first and second SIR's 110a and 110b to be adjacent and made face to face virtually in parallel with each other with a clearance 117 from each other. The first and second SIR's 110a and 110b are magnetic-field coupled with each other with a coupling degree of k12.

Respective first transmission lines 111b and 111c of the second and third SIR's 110b and 110c are disposed so as to allow the second and third SIR's 110b and 110c to be adjacent and made face to face virtually in parallel with each other with a clearance 118 from each other. The second and third SIR's 110b and 110c are magnetic-field coupled with each other with a coupling degree of k23.

A capacitor 116 is connected to a center portion of the first transmission line 111a of the first SIR 110a so that an input terminal is formed by capacitive coupling. Moreover, an output terminal is formed in the vicinity of a short-circuit grounding unit 114c of a third transmission line 113c of the third SIR 110c by tapping coupling.

By adjusting the layout positions of the respective SIR's 110a, 110b and 110c, that is, by adjusting the clearances 117 and 118, it is possible to adjust the degree of coupling and consequently to design characteristics of a filter and adjust the filter.

In FIG. 11, the explanation has been given on a configuration of a bandpass filter having SIR's of three stages; however, the stage number of the SIR's is not limited to the three stages, a filter circuit may be configured by using any number of stages. Moreover, with respect to coupling patterns between SIR's, layout patterns as indicated by FIGS. 5A to 5D may be used in combination. With respect to the shape of the SIR, not limited to the loop shape, those having desired shapes, such as linear shapes shown in FIGS. 3 and 8, may be used in combination. Various combinations may be selected depending upon easiness of designing, easiness of production, limitations in packaging and the like. When taking into consideration that the short-ended SIR of the present invention has a small size, it becomes possible to realize a small-size bandpass filter having high degree of freedom in designing.

Figure 12:
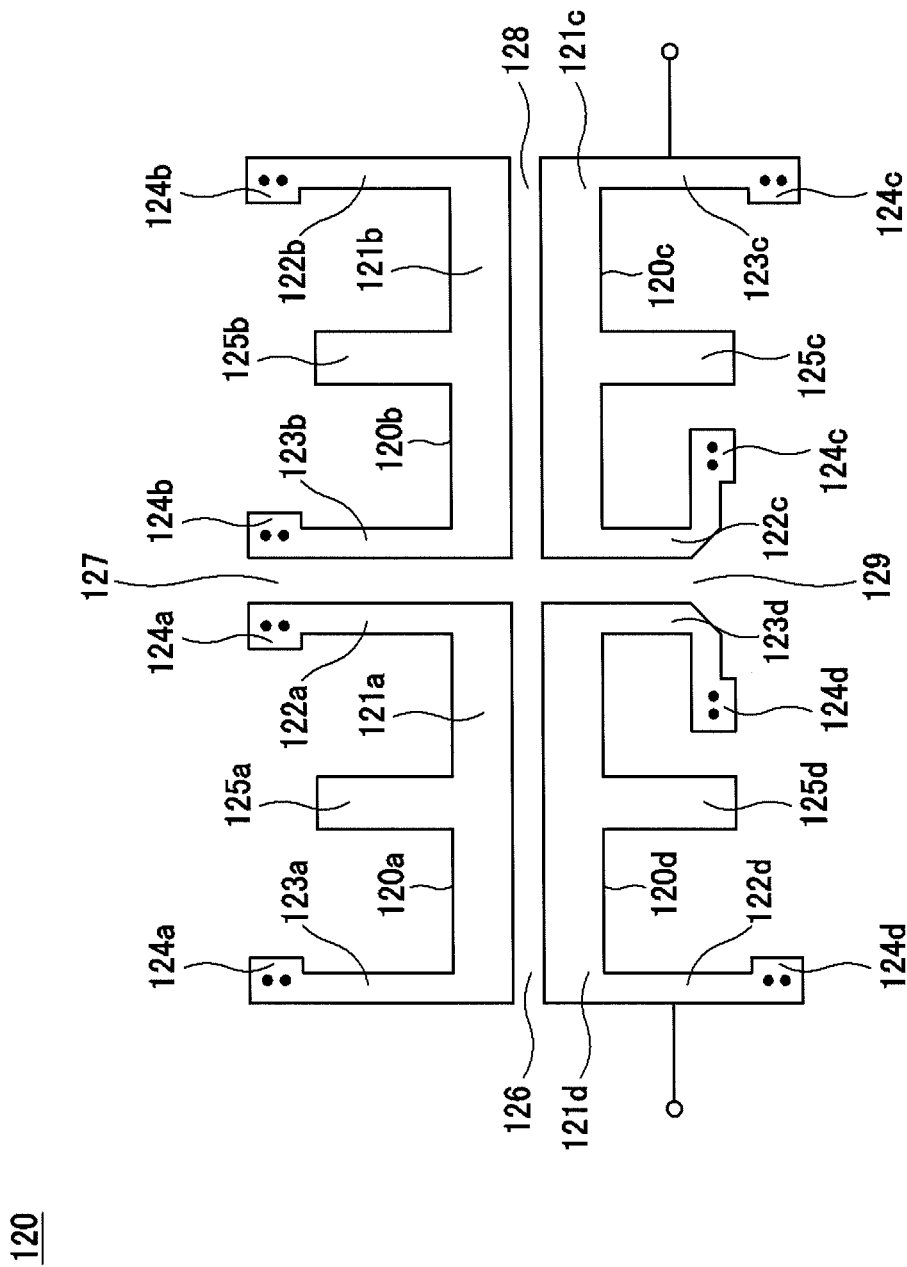
FIG. 12 is a view showing an example of a cross-coupling filter in which positions of attenuation poles in a blocking band are adjusted by weakly coupling input/output resonators with each other by using the transmission line resonators of the present invention.

FIG. 12 is a drawing that shows an example of a cross-coupling filter serving as one kind of a polar filter, which is configured by utilizing characteristics of the short-ended SIR of the present invention in that various coupling systems are available. The polar filter is highly valuable in utility when applied to a system in which an abrupt attenuation characteristic is required.

A cross-coupling filter 120 shown in FIG. 12 is composed of four SIR's 120a, 120b, 120c and 120d having virtually the same structure. The first SIR 120a forming the cross-coupling filter 120 has its rectangular-shaped second and third transmission lines 122a and 123b connected to two ends in the long side direction of the rectangular-shaped first transmission line 121a. The other ends of the second and third transmission lines 122a and 123a are connected to a rear surface grounding pattern (not shown) serving as a short-circuit grounding unit 124a through via holes. A capacitive element 125a formed by an open-circuited stub is connected to a center portion of the first transmission line 121a. The second, third and fourth SIR's 120b, 120c and 120d forming the cross-coupling filter 120 have the same structure and characteristics as those of the first SIR 120a. However, as will be described later, a second transmission line 122c of the third SIR 120c and a third transmission line 123d of the fourth SIR 120d are respectively disposed in a manner so as to be bent into an L-letter shape in the directions of capacitive elements 125c and 125d of the respective SIR's. Moreover, an input terminal is magnetic-field coupled to a second transmission line 122d of the fourth SIR 120d by tapping coupling, and an output terminal is magnetic-field coupled to a third transmission line 123c of the third SIR 120c by tapping coupling.

The first SIR 120a has its first transmission line 121a disposed so as to be adjacent and made virtually in parallel with the first transmission line 121d of the fourth SIR 120d, with a clearance 126 from each other. By the clearance 126, the degree of coupling k14 of the first and fourth SIR's 120a and 120b is controlled.

The second SIR 120b has its third transmission line 123b disposed so as to be adjacent and made virtually in parallel with the second transmission line 122a of the first SIR 120a, with a clearance of 127 from each other. By the clearance 127, the degree of coupling k12 of the first and second SIR's 120a and 120b is controlled.

The third SIR 120c has its first transmission line 121c disposed so as to be adjacent and made virtually in parallel with the first transmission line 121b of the second SIR 120b, with a clearance 128 from each other. By the clearance 128, the degree of coupling k23 of the second and third SIR's 120b and 120c is controlled.

The fourth SIR 120d has its third transmission line 123d disposed so as to be adjacent and made virtually in parallel with the second transmission line 122c of the third SIR 120c, with a clearance 129 from each other. By the clearance 129, the degree of coupling k34 of the third and fourth SIR's 120c and 120d is controlled.

Moreover, in the example of FIG. 12, the first to fourth SIR's 120a to 120d are disposed in a lattice shape.

By changing the clearances 126 to 129, the degrees of coupling k12, k23, k34 and k14 are designed to appropriate values, and adjusted. Moreover, as shown in FIG. 12, so as to make the degree of coupling k34 between the fourth SIR 120d having an input terminal and the third SIR 120c having an output terminal weaker than the other degrees of coupling k12, k14 and k23, the tip portions corresponding to the short-circuit grounding units of the third transmission line 123d and the second transmission line 122c are bent into an L-letter shape so as to be departed from each other. In this manner, by adjusting the degree of coupling k34, the positions where attenuation poles are generated can be easily controlled.

Additionally, in the example of FIG. 12, a method has been explained in which the positions where the attenuation poles are generated are set by adjusting the degree of coupling between the SIR's having an input and an output; however, not limited to the degree of coupling between the SIR's having an input and an output, it is possible to design filter characteristics, such as attenuation poles and the like, by adjusting mutual degrees of coupling of desired two SIR's selected from the SIR's forming a cross-coupling filter.

Moreover, in the example shown in FIG. 12, the cross-coupling filter 120 constituted by four SIR's has been exemplified; however, the cross-coupling filter can be formed as long as three or more SIR's are prepared. With respect to the shape of SIR's, not limited to the opened loop shape as shown in the example of FIG. 12, an SIR having the closed loop shape connected with the short-circuit grounding unit as shown in the example of FIG. 1 may be used, and an SIR having the linear shape as shown in FIG. 8 may of course be used. Not limited to a structure using a plurality of SIR's having the same shape, a structure in which SIR's with different shapes are mutually combined may of course be used. Moreover, with respect to the capacitive element forming a cross-coupling filter, a lumped constant element, such as a capacitor, may be used, or a distributed constant element utilizing a stub, as shown in FIG. 5, may be used, or a variable capacitive element, such as a variable capacitive diode, may be used, or an element in which these are combined with one another may also be used.

2-2. Multiplexer

By using a plurality of bandpass filters constituted by the short-ended SIR of the present invention, a multiplexer or a transmitter-receiver antenna duplexer can be realized. Additionally, the multiplexer and the transmitter-receiver antenna duplexer are different in application depending on directions of signals to be inputted and outputted; however, they are the same in circuit configuration. The multiplexer is a circuit in which by allowing input signals having a plurality of frequency components to pass through filters having different passing bands, output signals having different frequency components contained in the input signal are respectively outputted. On the other hand, the transmitter-receiver antenna duplexer is a circuit in which, in a radio apparatus or the like, a transmission signal and a receiving signal having different frequencies are transmitted and received by using a single antenna, and is constituted by a filter for allowing a transmission signal generated in the apparatus to pass so as to be sent to the antenna and a filter for allowing the received signal from the antenna to pass to be received and sent to a receiving circuit in the apparatus. The following explanation will be given by exemplifying a multiplexer.

Figure 13:
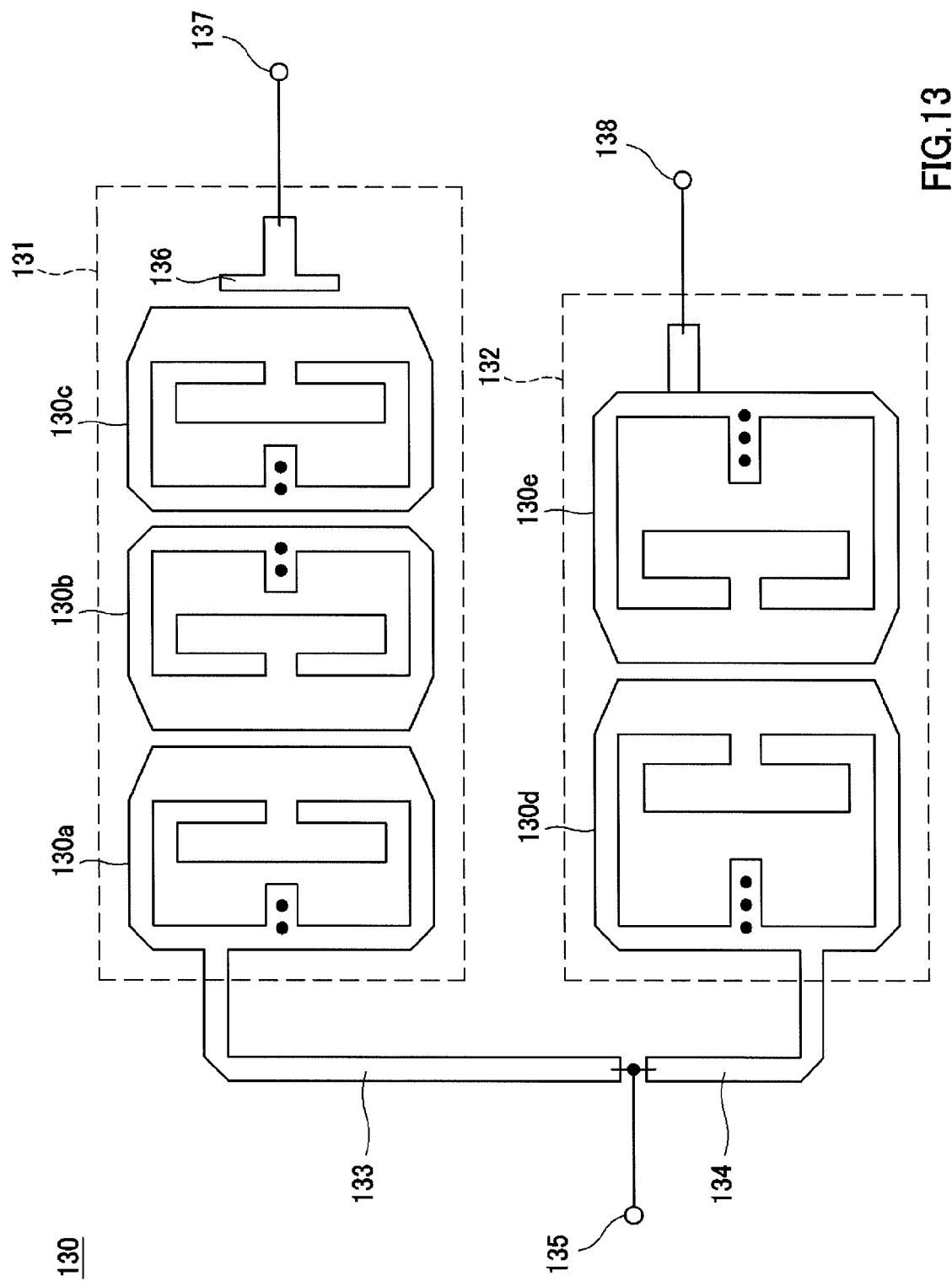
FIG. 13 is a view that shows an example in which a bandpass filter is configured by using the transmission line resonators of the present invention so that a multiplexer is configured by using two of the bandpass filters having different bandpass frequencies. Supposing that a shared antenna is used as an input and that one of outputs is used as a transmission output, with the other output being used as a receiving input, the resulting device can be used as a transmission-receiving antenna duplexer.

A multiplexer shown in FIG. 13 is provided with a first bandpass filter 131 having a first resonance frequency f1, which is constituted by SIR's 130a, 130b and 130c with three stages of the present invention, and a second bandpass filter 132 having a second resonance frequency f2, which is constituted by SIR's 130d and 130e with two stages of the present invention. Moreover, a first input terminal 133 that is magnetic-field coupled with the first bandpass filter 131, a second input terminal 134 that is magnetic-field coupled with the second bandpass filter 132 and a third input terminal 135 of the multiplexer 130 in which these inputs are magnetic-field coupled with each other by tapping coupling are further provided. In order to obtain an output signal corresponding to the resonance frequency f1, a first output terminal 137 that is electric-field coupled to the first bandpass filter 131 through a coupling capacitance 136 constituted by a T-type stub is provided, and in order to obtain an output signal corresponding to the resonance frequency f2, a second output terminal 138 that is magnetic-field coupled to the second bandpass filter 132 through tapping coupling is also provided.

When an input signal containing frequencies f1 and f2 is inputted through the input terminal 135, the signal is allowed to pass through the first bandpass filter 131 and an output signal of the frequency f1 is obtained through the output terminal 137. Moreover, the input signal is allowed to pass through the second bandpass filter 132 and an output signal of frequency f2 is obtained through the output terminal 138.

The above-mentioned operations are operations as the multiplexer, and in the case of the transmitter-receiver antenna duplexer, the following operations are carried out.

A transmitter-receiver antenna (not shown) is connected to the input terminal 135. Then, by using the output terminal 137 as a transmission signal input, the signal having the frequency f1 is allowed to pass through the first bandpass filter 131 so as to be sent to the transmitter-receiver antenna. On the other hand, the received signal through the transmitter-receiver antenna is sent to the output terminal 138 via the second bandpass filter 132, and outputted therefrom as a received signal having the frequency f2.

In FIG. 13, explanations have been given by exemplifying the two bandpass filters; however, not limited by the two, a multiplexer may be configured by using a desired number of bandpass filters so as to obtain the corresponding desired frequency outputs. Moreover, as indicated by examples of FIG. 11 or FIG. 12, the bandpass filters forming a multiplexer may also be configured by combining desired number and desired shapes of SIR's of the present invention under predetermined designing conditions. Not limited to the example of FIG. 13, in order to configure an input terminal, either of electric field coupling and magnetic field coupling may be used, and upon configuring an output terminal, either of electric field coupling and magnetic field coupling may be used.

2-3. Balanced-to-Unbalanced Transformer, Power Divider, Unbalanced-to-Balanced Transformer As shown in FIG. 1 or the like, the short-ended SIR of the present invention is formed into a line symmetrical structure with the center portion of the first transmission line being set as its symmetrical line, and by utilizing this symmetrical structure, a balanced circuit can be easily configured. In the high-frequency circuit, in most of the cases, semiconductor elements or the like are configured by balanced circuits, and in order to provide interface therewith, small-size balanced-to-unbalanced transformer and unbalanced-to-balanced transformer are very effectively utilized.

(1) Balanced-to-Unbalanced Transformer, Power Divider

Figure 14:
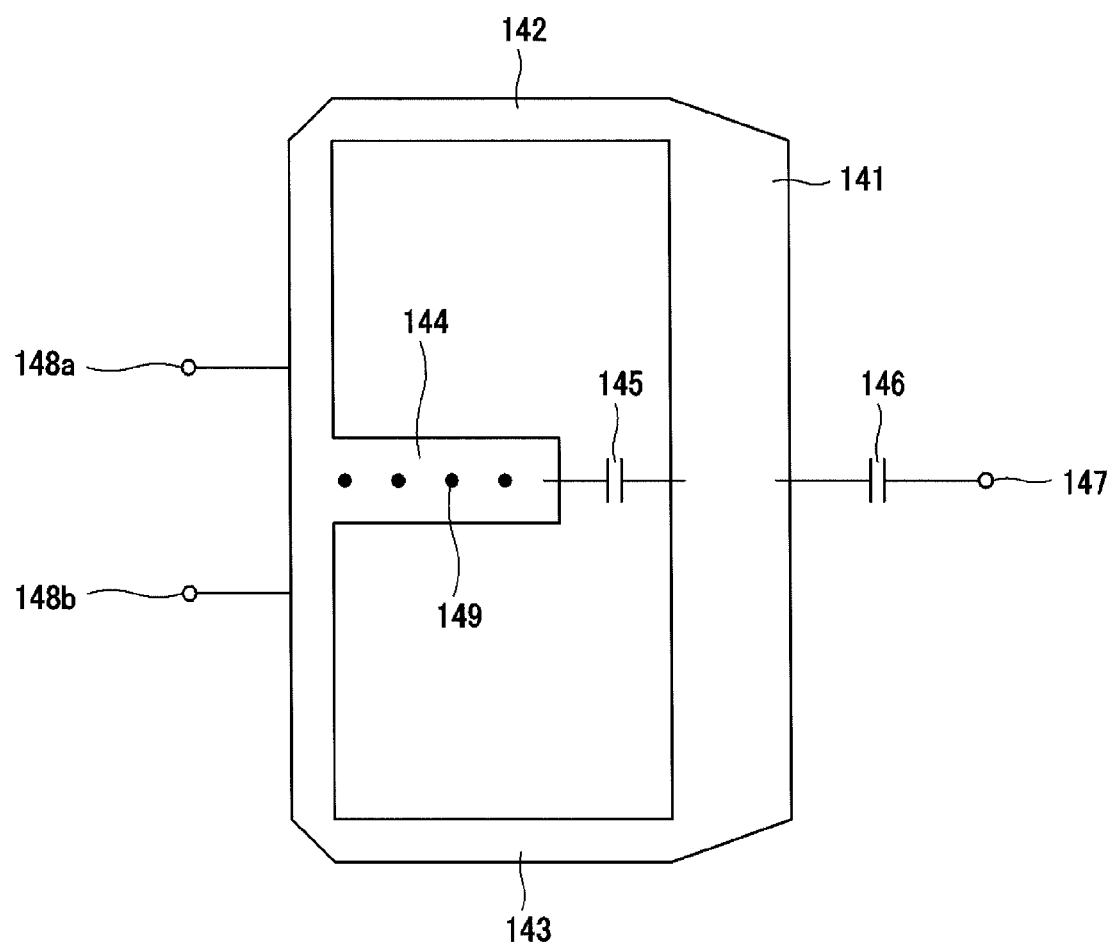
FIG. 14 is a view that shows an example in which a balanced-to-unbalanced transformer, which transforms a balanced input to an unbalanced output, is configured by using the transmission line resonators of the present invention. In the case when the input and the output are reversed in this circuit, that is, in the case when a signal is inputted to one of output terminals, with respective signals being outputted from two input terminals, the resulting device functions as a power divider.

FIG. 14 shows an example of a balanced-to-unbalanced transformer using the short-ended SIR of the present invention. In the same manner as in FIG. 1, by forming a line symmetrical structure with the center portion of the first transmission line being set as its symmetrical line, a balanced input circuit can be easily configured.

The balanced-to-unbalanced transformer shown in FIG. 14 includes the same short-ended SIR as that of FIG. 1. That is, a first transmission line 141 is prepared and a second transmission line 142 is connected to one of the ends of the first transmission line 141 in a direction virtually at a right angle with the longitudinal direction of the first transmission line 141. Moreover, a third transmission line 143 is connected to the other end of the first transmission line 141 in a direction virtually at a right angle with the longitudinal direction of the first transmission line 141. The second transmission line 142 and the third transmission line 143 are formed into a "U" letter shape, with the second transmission line 142 and the third transmission line 143 being connected with each other by a short-circuit grounding unit 144 on a side opposite to the side connected to the first transmission line 141 so as to be electrically short-circuited. The short-circuit grounding unit 144 is connected to a grounding unit (not shown) formed on one surface of the substrate rear surface through via holes 149. Each of first and second input terminals 148a and 148b is magnetic-field coupled to the vicinity of the short-circuit grounding unit 144 of the second and third transmission lines 142 and 143 by tapping coupling. In this case, in the example of FIG. 14, the first and second input terminals 148a and 148b are disposed so as to have an equal distance from the short-circuit grounding unit 144 so that electrical balance can be ensured. In general, by selecting points at which the intensities of magnetic field at the respective coupling points of the first and second input terminals become equal to each other, the first and second input terminals are coupled to the short-ended SIR 140.

An output terminal 147 is electric-field coupled to the center portion of the first transmission line 141 by using a coupling capacitor 146. An output signal is an unbalanced signal.

Next, when the balanced-to-unbalanced transformer of the present invention is viewed from the output terminal 147, the circuit is equivalent to the same quarter-wavelength resonators with one-end opened and the other end short-circuited that are connected in parallel with each other. Therefore, in the case when an unbalanced signal is inputted by using the output terminal 147 in the example of FIG. 14 as an input side, from the two input terminals 148a and 148b, not balanced signals having reversed phases, but signals having the same phase are outputted so that this circuit can be utilized as a power divider.

In the example of FIG. 14, the shape of the SIR is a closed loop shape; however, it may be formed into an opened loop shape in which the ends to be short-circuit grounded of the second and third transmission lines are not connected inside the same layer. Moreover, in the same manner as described earlier, the capacitive element is not limited to a lumped constant element, and may be a distributed constant element. In the same manner as described earlier, by using a variable capacitive element, a tuning circuit can be configured.

(2) Unbalanced-to-Balanced Transformer

Figure 15:
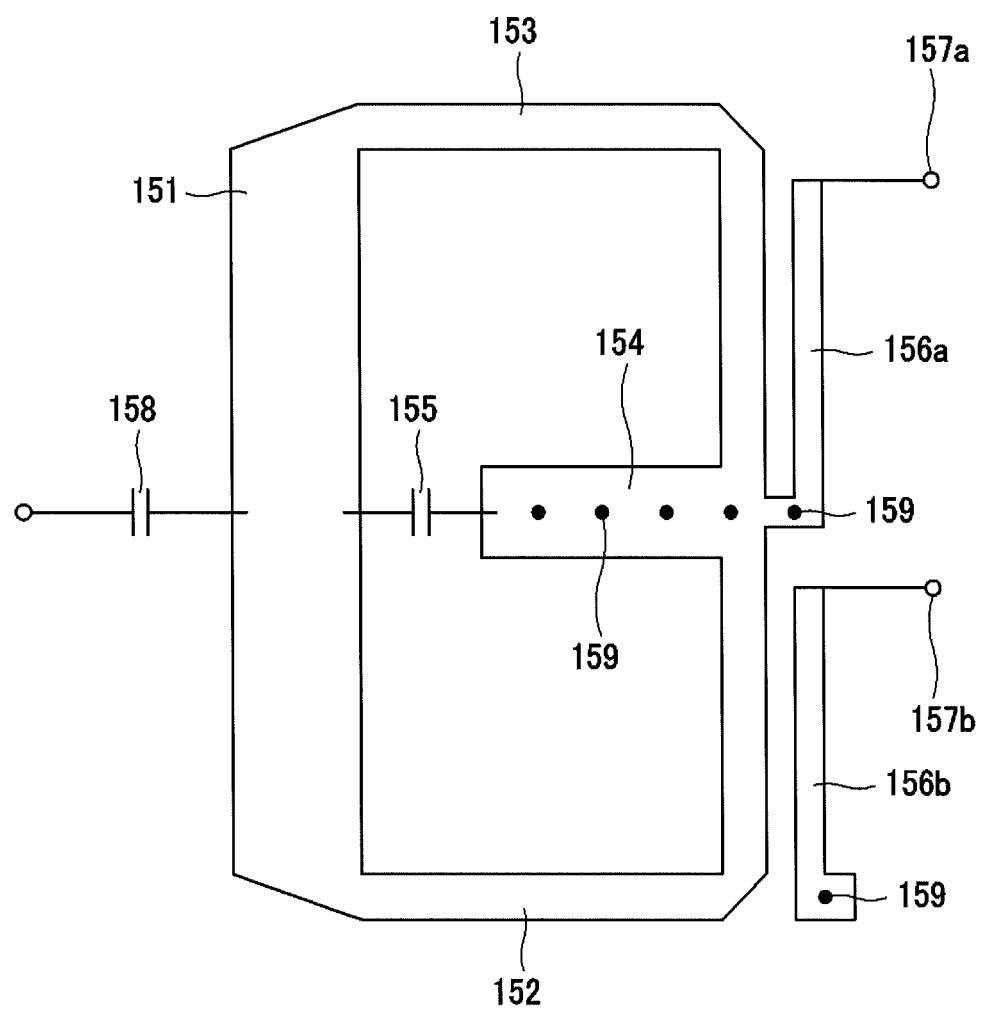
FIG. 15 is a view that shows an example in which an unbalanced-to-balanced transformer, which transforms an unbalanced input to a balanced output, is configured by using the transmission line resonators of the present invention.

As described above, even when an unbalanced signal is inputted to the circuit of FIG. 14, the circuit is only allowed to function as a power distributor for outputting two signals of the same phase. Therefore, in order to realize a circuit which can output a balanced signal when an unbalanced signal is inputted thereto, by using the short-ended SIR of the present invention, it is necessary to add a phase adjusting mechanism to the circuit of FIG. 14. FIG. 15 shows an example in which by adding the phase adjusting mechanism to the SIR of the present invention, an unbalanced-to-balanced transformer 150 is configured.

The SIR included in the unbalanced-to-balanced transformer shown in FIG. 15 is the same SIR shown in FIG. 1. That is, the SIR has a structure in which a first transmission line 151 is prepared and a second transmission line 152 is connected to one of the ends of the first transmission line 151 in a direction virtually at a right angle with the longitudinal direction of the first transmission line 151, with a third transmission line 153 being connected to the other end of the first transmission line 151 in a direction virtually at a right angle with the longitudinal direction of the first transmission line 151. The second transmission line 152 and the third transmission line 153 are formed into a "U" letter shape, with the second transmission line 152 and the third transmission line 153 being connected with each other by a short-circuit grounding unit 154 on a side opposite to the side connected to the first transmission line 151 so as to be electrically short-circuited. In the short-circuit grounding unit 154, the second and third transmission lines 152 and 153 are connected to a grounding unit (not shown) formed on one surface of the substrate rear surface through via holes 159. Respective first and second phase adjusting units 156a and 156b, each having a rectangular shape, are disposed so as to be spaced therefrom and made face to face in parallel with the second and third transmission lines 152 and 153. An end of the first phase adjusting unit 156a closer to the short-circuit grounding unit 154 is connected to the short-circuit grounding unit through the via holes 159. An end of the second phase adjusting unit 156b that is farthest from the short-circuit grounding unit 154 is connected to the short-circuit grounding unit 154 through the via holes 159. To the ends of the first and second phase adjusting units 156a and 156b on the sides without the via holes 159, first and second output terminals 157a and 157b are respectively magnetic-field coupled by tapping coupling. An input terminal for use in unbalanced input is electric-field coupled to a center portion of the first transmission line 151 by a coupling capacitor 158.

As described above, an input signal inputted from the input terminal through an electric-field coupling is excited and driven with the quarter-wavelength resonator with one end opened and the other end short-circuited, connected in parallel therewith, serving as a signal having the same phase, and transmitted through the second and third transmission lines 153 and 154 to reach the short-circuit grounding unit. In this case, since the first and second phase adjusting units 156a and 156b have their grounding points located at positions respectively opposed to the position of the short-circuit grounding unit 154 of the SIR, the same phase signals that have passed through the second and third transmission lines are phase-changed in the first and second phase adjusting units 156a and 156b by 180°. By appropriately selecting the grounding points of the first and second phase adjusting units 156a and 156b, the phases of the two signals can be changed by 180° so that a balanced output signal can be obtained.

Figures 16A, 16B:
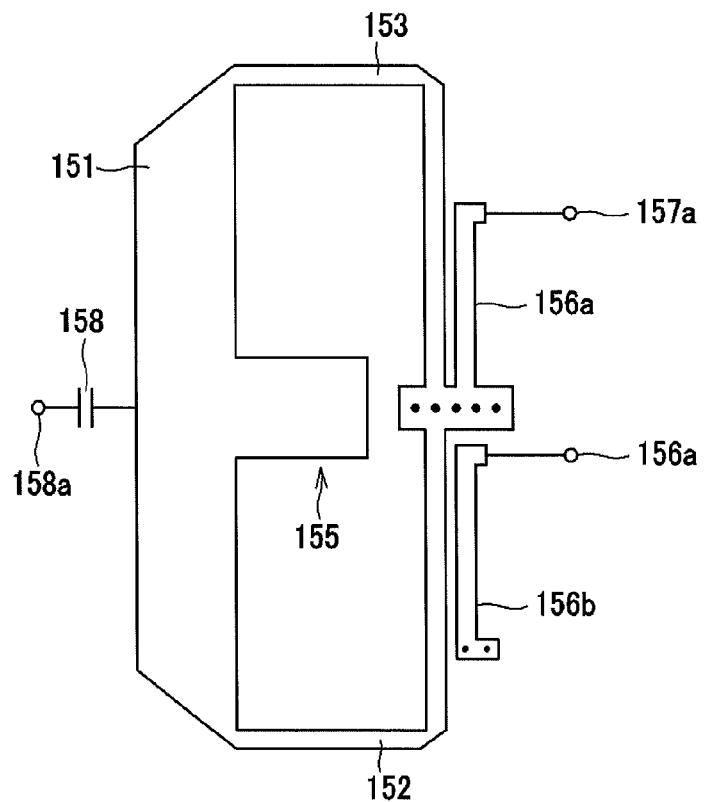
FIG. 16A shows a circuit of the unbalanced-to-balanced transformer for use in simulation.
FIG. 16B shows the simulation circuit of FIG. 16A.

With respect to the above-mentioned unbalanced-to-balanced transformer, operations thereof were confirmed by using a simulation technique. FIGS. 16A and 16B show circuits used for the simulation. The circuit shown in FIG. 16A has virtually the same configuration as that of FIG. 15, but is different therefrom in that a capacitive element 155 to be loaded in the center portion of the first transmission line 151 is prepared as a capacitive stub. Based upon the circuit shown in FIG. 16A, a simulation circuit was configured by setting circuit constants as shown in FIG. 16B, and the simulation was carried out. In FIG. 16B, Port 1 corresponds to the input terminal 158a, Port 2 corresponds to the first output terminal, and Port 3 corresponds to the second output terminal. Moreover, by utilizing the fact that a stepped-impedance resonator composed of the first transmission line 151, the second transmission line 152 and the third transmission line 153 forms a line symmetrical shape with a line connecting the center portion of the first transmission line 151 and the short-circuit grounding unit serving as a symmetrical axis, circuit constants for use in the simulation were determined.

Figure 17A:
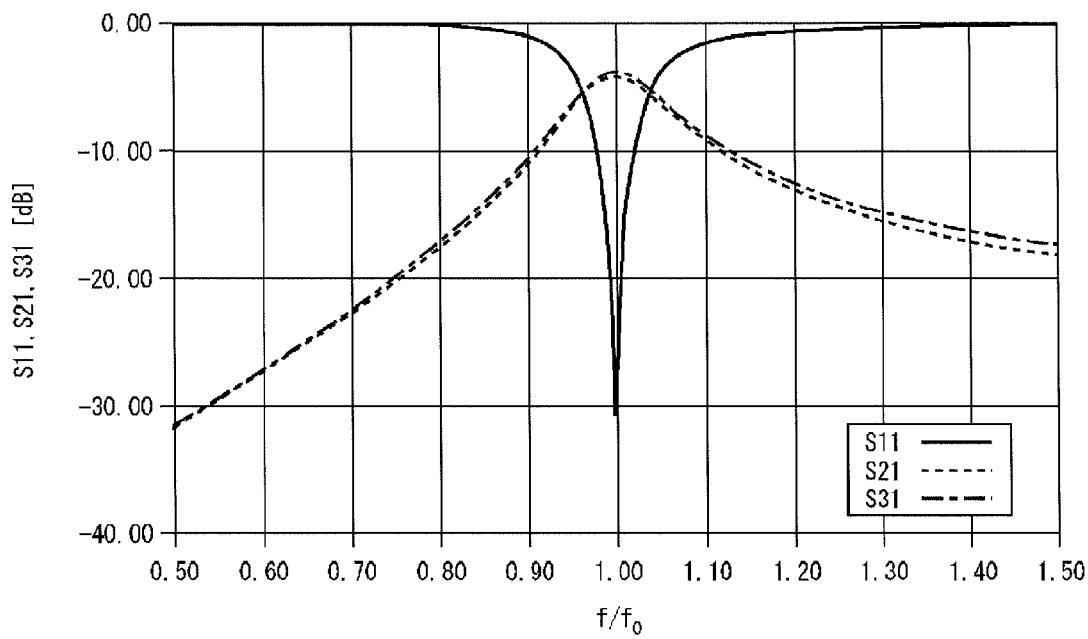
FIG. 17A is a graph that shows frequency characteristics of a reflection coefficient of Port 1, a transmission coefficient S21 from Port 1 to Port 2 and a transmission coefficient S31 from Port 2 to Port 3 of the simulation results of the simulation circuit of FIG. 16B.
Figure 17B:
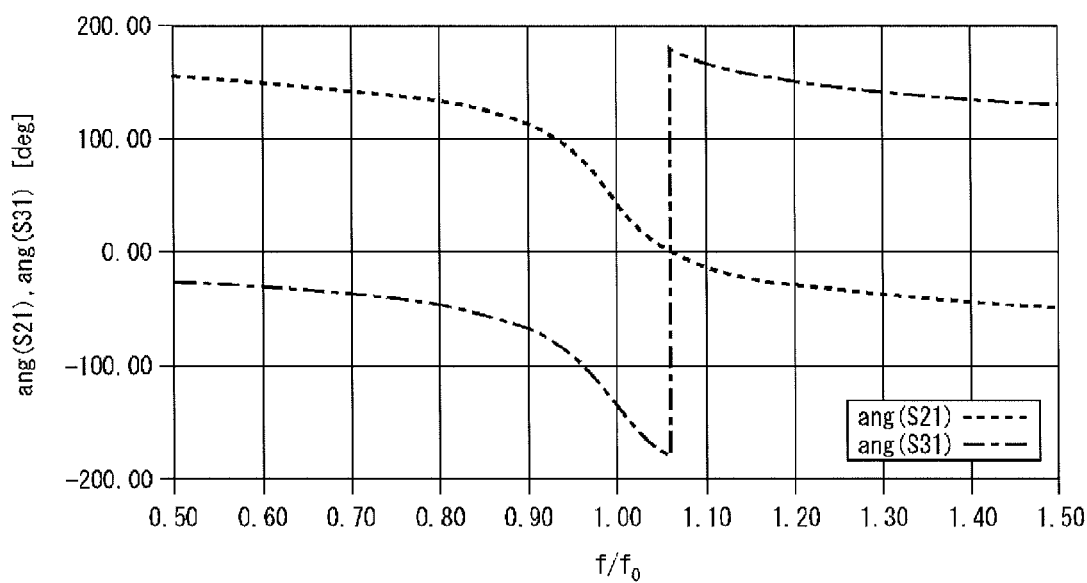
FIG. 17B is a graph that shows frequency characteristics of phases of transmission coefficients S21 and S31.

As shown in FIG. 17A, a transmission coefficient S21 from Port 1 to Port 2 and a transmission coefficient S31 from Port 1 to Port 3 exhibit virtually the same frequency characteristic. Moreover, as shown in FIG. 17B, the phase characteristics of the transmission coefficients S21 and S31 have a phase difference virtually by 180°, which indicates that a balanced signal is outputted.

In the example of FIG. 15, the shape of the SIR is a closed loop shape; however, it may be formed into an opened loop shape in which the ends to be short-circuit grounded of the second and third transmission lines are not connected inside the same layer. Moreover, as described earlier, the capacitive element is not limited to a lumped constant element, and may be a distributed constant element. In the same manner as in the example of FIG. 14 or the like, by using a variable capacitive element, a tuning circuit can be configured.

Additionally, by replacing the input and the output of the unbalanced-to-balanced transformer as shown in FIG. 15 with each other, the resulting device, as it is, can be operated as a balanced-to-unbalanced transformer.

2-4. Frequency Mixer

When the unbalanced-to-balanced transformer as shown in the example of FIG. 15 is used, it is possible to configure a mixer circuit by which a local oscillation signal is mixed with a high frequency input signal to generate an intermediate frequency signal. By using the SIR of the present invention, it is possible to provide a small-size mixer circuit having high degree of designing freedom.

(1) Single Balanced Mixer

Figure 18:
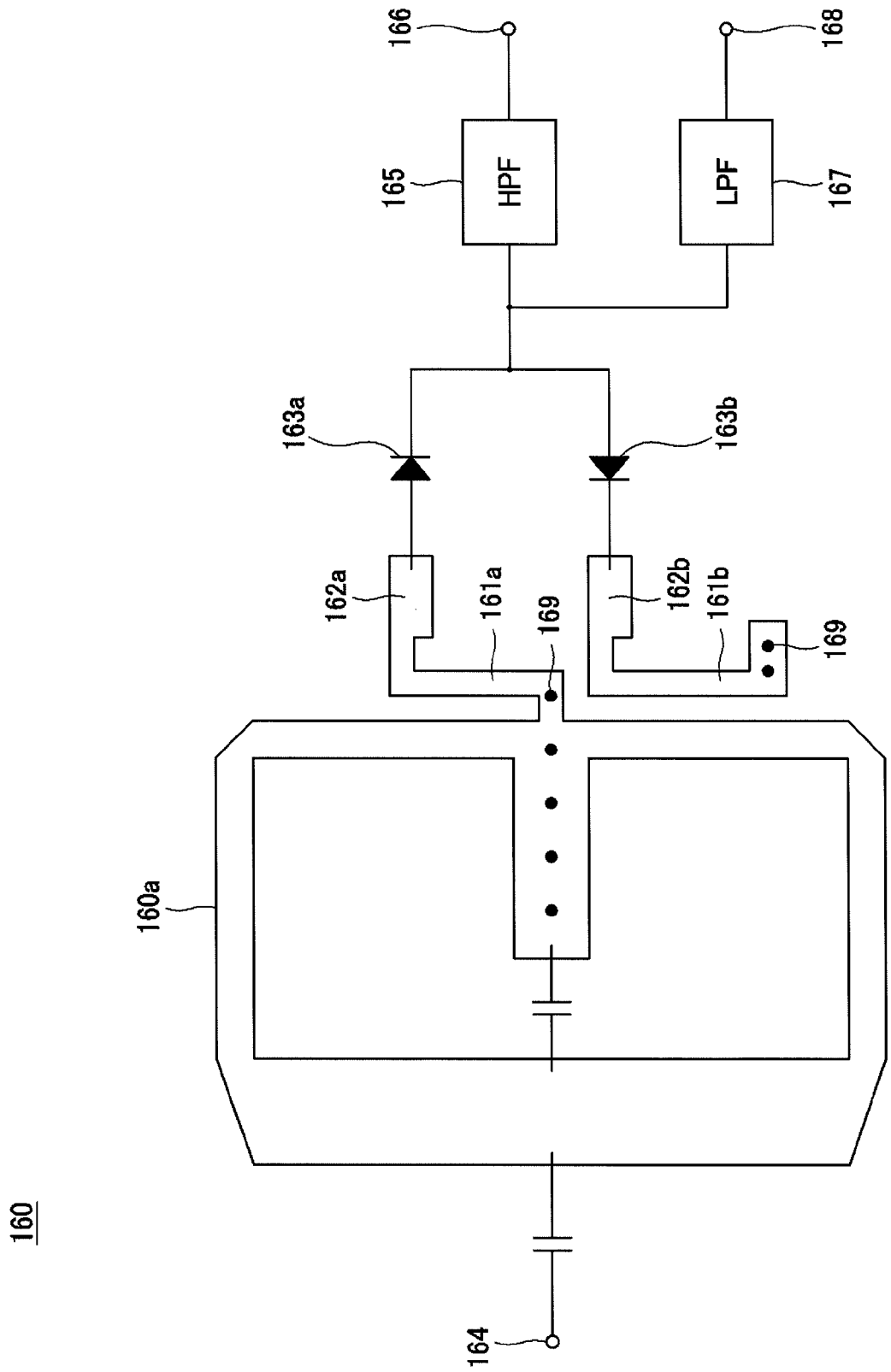
FIG. 18 is a view showing an example in which by utilizing the unbalanced-to-balanced transformer using the transmission line resonators of the present invention as a local transmission signal input unit, a single balanced mixer having a high frequency mixing unit, a high frequency signal input unit and an intermediate frequency signal output unit is configured.

FIG. 18 is a drawing that shows a single balanced mixer 160 using the SIR of the present invention, which is used when a high-frequency input signal is an unbalanced signal.

The single balanced mixer 160 is provided with an unbalanced-to-balanced transformer 160a to which a local oscillation signal serving as an unbalanced signal is inputted, a high frequency mixing unit that detects the local oscillation signal and the high frequency signal and mixes the signals with each other, and a high frequency signal input unit 165 to which the high frequency signal is inputted so as to be outputted to the high frequency mixing unit and an intermediate frequency signal output unit 167 that outputs an intermediate frequency signal generated by the high frequency mixing unit.

The unbalanced-to-balanced transformer 160a is provided with a local oscillation input terminal 164 to which the local oscillation signal from a local oscillator (not shown) is inputted and first and second output terminals 162a and 162b. Signals having the same phase outputted from the first and second output terminals 162a and 162b are phase-changed by the first and second phase adjusting units 161a and 161b to be formed into balanced signals having different phases by 180°. The high frequency mixing unit is composed of first and second diodes 163a and 163b. To the first output terminal 162a of the unbalanced-to-balanced transformer 160a, an anode of the first diode 163a is magnetic-field coupled by tapping coupling, and to the second output terminal 162b, a cathode of the second diode 163b is magnetic-field coupled by tapping coupling. The cathode of the first diode and the anode of the second diode are mutually connected to each other. The high frequency signal input unit 165 is a high bandpass filter to which a high frequency signal serving as an unbalanced signal is inputted so as to generate a signal to be inputted to the high frequency mixing unit. The high frequency signal input unit 165 is connected to a connection point between the anode of the first diode and the cathode of the second diode so as to input a high frequency signal to the high frequency mixing unit. The local oscillation signal inputted from the local oscillation input terminal 164 and the high frequency signal inputted from the high frequency signal input terminal 166 are detected and mixed with each other by the high frequency mixing unit composed of the first and second diodes 163a and 163b, and sent to an intermediate frequency output unit 167 so that the resulting signal is outputted from an intermediate frequency signal output terminal 168 as an intermediate frequency signal. The intermediate frequency signal output unit 167 is a low bandpass filter.

In the example of FIG. 18, the shape of the SIR is a closed loop shape; however, it may be formed into an opened loop shape in which the ends to be short-circuit grounded of the second and third transmission lines are not connected inside the same layer. Moreover, in the same manner as described earlier, the capacitive element is not limited to a lumped constant element, and may be a distributed constant element. In the same manner as described earlier, by using a variable capacitive element, a tuning circuit can be configured.

(2) Double Balanced Mixer

Figure 19:
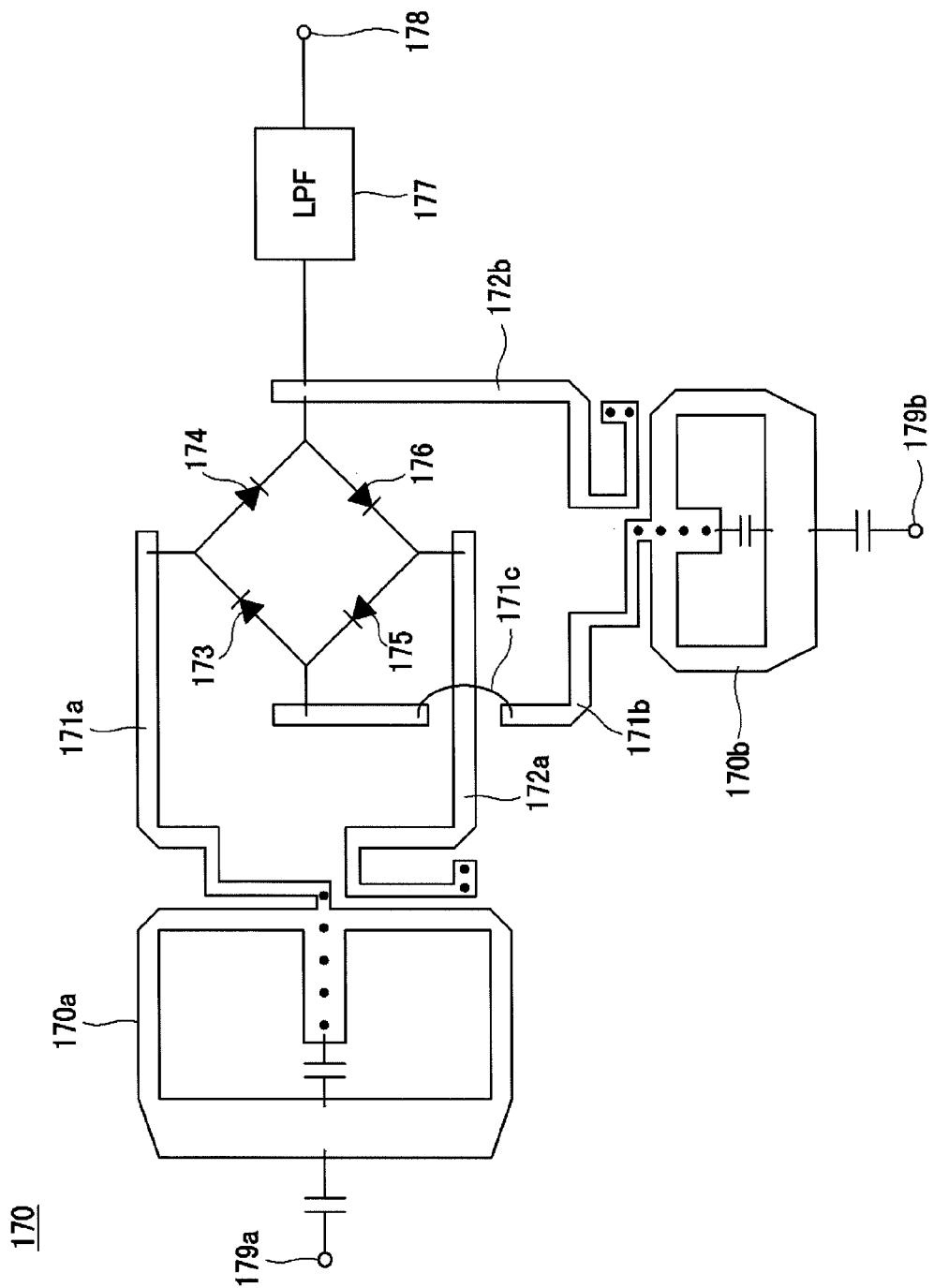
FIG. 19 is a view showing an example of a double balanced mixer in which the high frequency signal input unit of the single balanced mixer of FIG. 16 is replaced by an unbalanced-to-balanced transformer using the transmission line resonators of the present invention.

FIG. 19 is a drawing that shows an example of a double balanced mixer 170 in which two unbalanced-to-balanced transformers using the SIR's of the present invention having different resonance frequencies are used. A first unbalanced-to-balanced transformer 170a to which a local oscillation signal is inputted is the same as that shown in FIG. 18. In this case, the high frequency signal input unit 165 in the example of FIG. 18 is replaced by a second unbalanced-to-balanced transformer 170b so as to deal with a high frequency signal to be balance-inputted. In general, since a finite difference between a frequency of a high frequency signal and a local oscillation frequency is taken as an intermediate frequency, the resonance frequency of the second unbalanced-to-balanced transformer 170b is set to a frequency higher than the resonance frequency of the first unbalanced-to-balanced transformer 170a.

The high frequency mixing unit is composed of first to fourth diodes 173 to 176 that are bridge-connected to one another. A first output terminal 171a of the first unbalanced-to-balanced transformer 170a is connected to a cathode of the first diode 173 and an anode of a second diode 174 forming the high frequency mixing unit. A second output terminal 172a of the first unbalanced-to-balanced transformer 170a is connected to an anode of a third diode 175 and a cathode of a fourth diode 176 forming the high frequency mixing unit. A first output terminal 171*b* of the second unbalanced-to-balanced transformer 170*b* is connected to an anode of the first diode 173 and a cathode of the third diode 175 forming the high frequency mixing unit. A second output terminal 172*b* of the second unbalanced-to-balanced transformer 170*b* is connected to a cathode of the second diode 174 and an anode of the fourth diode 176 forming the high frequency mixing unit.

An output of the high frequency mixing unit composed of the first to fourth diodes 173 to 176 is inputted to an intermediate frequency signal output unit 177 through the connection point between the cathode of the second diode 174 and the anode of the fourth diode 176, and is outputted from an output terminal 178 as an intermediate frequency signal. The intermediate frequency signal output unit 177 is a low bandpass filter in the same manner as in the example of FIG. 18.

Additionally, as shown in FIG. 19, since a first output terminal 171*b* of the second unbalanced-to-balanced transformer 170*b* intersects with a second output terminal 172*a* of the first unbalanced-to-balanced transformer 170*a* at a crossover unit 171*c*, it is necessary to take countermeasures, such as, for example, changing a wiring layer for use in forming the second unbalanced-to-balanced transformer 170*b* thereon by utilizing a multilayer film. It is necessary to take the wiring length or the like into consideration so as not to cause a phase change in the crossover unit 171*c* and also so as to maintain the balanced state of the output signal.

In the example of FIG. 19, the shape of the SIR is a closed loop shape; however, it may be formed into an opened loop shape in which the ends to be short-circuit grounded of the second and third transmission lines are not connected inside the same layer. Moreover, in the same manner as described earlier, the capacitive element is not limited to a lumped constant element, and may be a distributed constant element. In the same manner as described earlier, by using a variable capacitive element, a tuning circuit can be configured.

2-5. Balance-Type Filter

By combining the SIR's of the present invention with each other, a balance-type filter with a balanced input and a balanced output may be easily configured.

Figure 20:
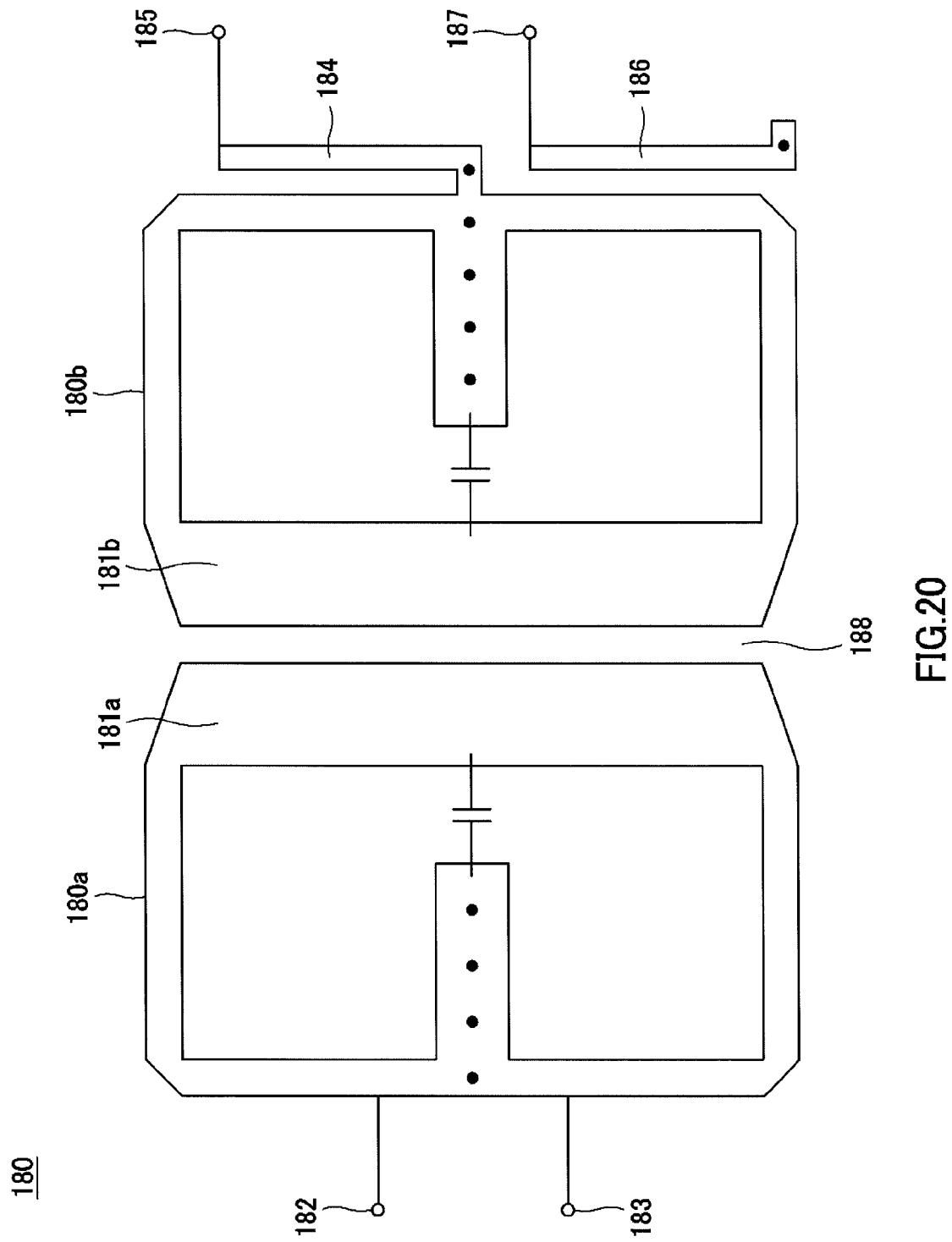
FIG. 20 is a view showing an example in which by using the transmission line resonators of the present invention, a balance-type filter for receiving a balanced signal and for outputting a balanced signal is configured.

FIG. 20 shows an example of a balance-type filter which is configured by coupling virtually the same balanced-to-unbalanced transformer 180*a* as shown in FIG. 14 and virtually the same unbalanced-to-balanced transformer 180*b* as shown in FIG. 15 with each other by electric-field coupling. A balance-type filter 180 is configured by utilizing electric-field coupling obtained by disposing the balanced-to-unbalanced transformer 180*a* and the unbalanced-to-balanced transformer 180*b* adjacent to each other, with respective first transmission lines 181*a* and 181*b* being spaced apart from each other with a clearance 188, and made face to face in parallel with each other.

The balance-type filter 180 is provided with the balanced-to-unbalanced transformer 180*a* having first and second input terminals 182 and 183 respectively tapping-coupled with the second and third transmission lines and the unbalanced-to-balanced transformer 180*b* having first and second output terminals 185 and 187 formed in first and second phase adjusting units 184 and 186. By a clearance 188 prepared between the balanced-to-unbalanced transformer 180*a* and the unbalanced-to-balanced transformer 180*b*, a degree of coupling k12 can be adjusted. By adjusting the degree of coupling k12, the attenuation characteristic of the filter can be designed and adjusted.

Although the example of FIG. 18 shows a filter having a structure with two stages, it is possible to further insert SIR's between the balanced-to-unbalanced transformer 180*a* and the unbalanced-to-balanced transformer 180*b* and to form a structure with multiple stages. In other words, in the case when an even number of SIR's are inserted between the balanced-to-unbalanced transformer 180*a* and the unbalanced-to-balanced transformer 180*b*, by allowing the first transmission lines to be mutually electric-field coupled, with the second or third transmission lines being mutually magnetic-field coupled, the adjacent SIR, balanced-to-unbalanced transformer 180*a* and unbalanced-to-balanced transformer 180*b* are successively coupled with one after another to be longitudinally connected so that a balance-type filter with multiple stages may be configured.

In this manner, by using the SIR's of the present invention, it is possible to easily configure a balance-type filter having a structure with multiple stages. By utilizing the feature of a miniaturized SIR of the present invention, it is possible to realize a balance-type filter with multiple stages that has a small size and high degree of freedom in designing.

In the example of FIG. 20, the shape of the SIR is a closed loop shape; however, it may be formed into an opened loop shape in which the ends to be short-circuit grounded of the second and third transmission lines are not connected inside the same layer. Moreover, in the same manner as described earlier, the capacitive element is not limited to a lumped constant element, and may be a distributed constant element. In the same manner as described earlier, by using a variable capacitive element, a tuning circuit can be configured.

Moreover, by using a plurality of the SIR's of the present invention, while successively coupling these by repeating electric-field coupling and magnetic-field coupling one after another, it is possible to configure a filter with multiple stages having a balanced input and an unbalanced output.

Figure 21:
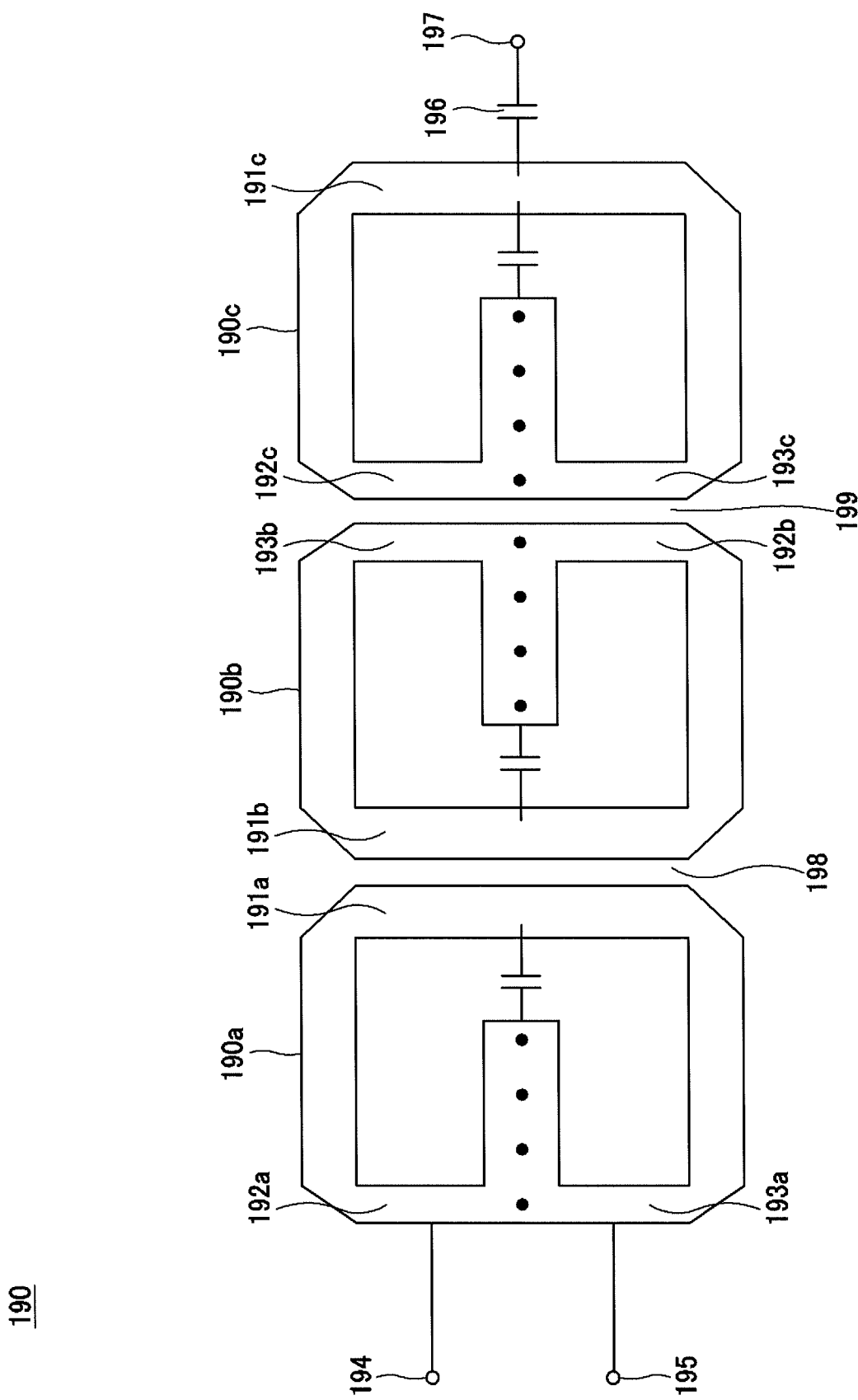
FIG. 21 is a view showing an example in which by using the transmission line resonators of the present invention, a bandpass filter with three stages for receiving a balanced signal and for outputting an unbalanced signal is configured.

FIG. 21 is a drawing that shows an example in which such a balanced input-unbalanced output bandpass filter is configured. In order to configure the balanced input-unbalanced output bandpass filter, an odd number of SIR's having the same resonance frequency are required, and in the case of FIG. 21, a bandpass filter 190 is configured by using three SIR's.

To second and third transmission lines 192*a* and 192*b* of a first short-ended SIR 190*a*, first and second input terminals are respectively magnetic-field coupled, with an equal distance from the short-circuit grounding unit by tapping coupling. A first transmission line 191*a* of the first short-ended SIR 190*a* and a first transmission line 191*b* of a second short-ended SIR 190*b* are disposed so as to allow the first and second SIR's 190*a* and 190*b* to be adjacent and made face to face virtually in parallel with each other with a clearance 198. Moreover, second and third transmission lines 192*b* and 193*b* of the second SIR 190*b* and second and third transmission lines 192*c* and 193*c* of a third SIR 190*c* are disposed so as to allow the second and third SIR 190*b* and 190*c* to be adjacent and made face to face in parallel with each other with a clearance 199. Output terminals are magnetic-field coupled with each other through a capacitor 196 from the center portion of the first transmission line 191*c* of the third SIR 190*c* so as to output an unbalanced output.

Although the example of FIG. 21 shows a bandpass filter having a structure with three stages, it is possible to further insert an even number of SIR's between the second SIR 190*b* and the third SIR 190*c* and consequently to provide a structure with multiple stages.

In the example of FIG. 21, the shape of the SIR is a closed loop shape; however, it may be formed into an opened loop shape in which the ends to be short-circuit grounded of the second and third transmission lines are not connected inside the same layer. Moreover, in the same manner as described earlier, the capacitive element is not limited to a lumped constant element, and may be a distributed constant element, and in the same manner as described earlier, by using a variable capacitive element, a tuning circuit can be configured.

In this manner, by utilizing to the utmost the features of the SIR of the present invention that a small-size device is obtained, that the coupling states can be easily controlled by using layout patterns of the SIR and external circuits and that a balanced circuit can be easily configured by using the symmetry of circuits, it becomes possible to realize various kinds of high-frequency applied circuits that have a small size with high degree of freedom in designing, such as the abovementioned bandpass filter, multiplexer, balanced-to-unbalanced transformer, power divider, unbalanced-to-balanced transformer, frequency mixer, balance-type filter, and the like.

The fact that a high degree of freedom in designing is obtained makes it possible to provide applied designs in various frequency bands, and consequently to easily provide multiple bands that have been recently demanded in radio apparatuses.

Moreover, when taken into consideration an interface with a semiconductor device in which a balanced circuit is adopted, the SIR and various kinds of high frequency applied circuits of the present invention make it possible to realize a filter configuration having a built-in balanced transform function, without the necessity of adding any special circuits; therefore, when formed into an MMIC device, such a miniaturization as to be as small as that obtained by a quarter-wavelength resonator can be achieved.

The invention claimed is:

1. A transmission line resonator comprising:
   a half-wavelength stepped-impedance resonator; and
   a capacitive element with one end connected to a center portion of the stepped-impedance resonator and the other end short-circuited to ground, and
   wherein the stepped-impedance resonator further comprises:
     a first transmission line having a first line impedance and a first line length;
     a second transmission line having a second line impedance and a second line length, with one end being connected to one end of the first transmission line and the other end being short-circuited to ground; and
     a third transmission line having the second line impedance and the second line length, with one end being connected to the other end of the first transmission line and the other end being short-circuited to ground,
   wherein the first line impedance is lowered in comparison with the second line impedance, and
   wherein the capacitive element satisfies the following formulas:

$$B = \frac{2 \cdot (R_Z - \tan\theta_1 \cdot \tan\theta_2)}{Z_1 \cdot (\tan\theta_2 + R_Z \cdot \tan\theta_1)} \quad \text{[Formula 1]}$$

$$R_Z = \frac{Z_1}{Z_2} \quad \text{[Formula 2]}$$

where jB represents an admittance of the capacitive element, $Z_1$ represents the first line impedance, $2\theta_1$ represents the first line length, $Z_2$ represents the second line impedance, and $\theta_2$ represents the second line length.

2. The transmission line resonator according to claim 1, wherein the first transmission line, the second transmission line and the third transmission line are disposed in a loop shape.

3. The transmission line resonator according to claim 1, wherein each of the first transmission line, the second transmission line and the third transmission line has a rectangular shape, with the second transmission line and the third transmission line being disposed at respective connection ends thereof in a direction with a right angle relative to the first transmission line.

4. The transmission line resonator according to claim 1, further comprising:
   an input terminal or an output terminal that is coupled to a vicinity of a center portion of the first transmission line by electric field coupling so as to input or output a signal of an external circuit; and
   an output terminal or an input terminal that is coupled to a vicinity of a short-circuit grounding unit of the second transmission line and/or the third transmission line by magnetic field coupling so as to output or input a signal of an external circuit.

5. The transmission line resonator according to claim 1, wherein the capacitive element is any one of members selected from the group consisting of a lumped constant element, a variable capacitive element and a distributed constant element.

6. The transmission line resonator according to claim 5, wherein the distributed constant element is any one of members selected from the group consisting of an inter-digital capacitor, a stub having a rectangular shape, a stub having an impedance step, a T-type stub or a stub having a folded line structure.

7. A transmission line resonator comprising:
   first and second transmission line resonators having features according to those of the transmission line resonator of claim 1,
   wherein the first transmission line resonator and the second transmission line resonator are disposed and coupled to each other so as to be adjacent and spaced apart from each other with a predetermined clearance.

8. A transmission line resonator comprising:
   first and second transmission line resonators having features according to those of the transmission line resonator of claim 1,
   wherein the first transmission line resonator and the second transmission line resonator are disposed so as to allow the first transmission line of the first transmission line resonator and the first transmission line of the second transmission line resonator to be adjacent in parallel with each other with a predetermined clearance so as to be electric-field coupled with each other, or so as to allow the second transmission line or the third transmission line of the first transmission line resonator and the second transmission line or the third transmission line of the second transmission line resonator to be adjacent in parallel with each other with a predetermined clearance so as to be magnetic-field coupled with each other.

9. A transmission line resonator comprising:
   first and second transmission line resonators having features according to those of the transmission line resonator of claim 1,
   wherein each of the first transmission line, the second transmission line and the third transmission line of the first transmission line resonator and the second transmission line resonator is disposed so as to have a loop shape, and the first transmission line resonator and the second transmission line resonator are disposed so as to allow a center portion of the first transmission line of the second transmission line resonator and a vicinity of virtually a center portion in a line path length between the second transmission line or the third transmission line and a short-circuit grounding unit to be adjacent in parallel with each other with a predetermined clearance from each other at a center portion of the first transmission line of the first transmission line resonator and a vicinity of virtually a center portion of a line path length between the second transmission line or the third transmission line and the short-circuit grounding unit.

10. A bandpass filter comprising:

two or more transmission line resonators having features according to the transmission line resonator of claim 1 having the same resonance frequency;

an input terminal that is electric-field coupled or magnetic-field coupled with one of the transmission line resonators among the two or more transmission line resonators; and an output terminal that is electric-field coupled or magnetic-field coupled with another transmission line resonator of the two or more transmission line resonators that is different from the one transmission line resonator, wherein the two or more transmission line resonators are disposed so as to be adjacent to one after another with a predetermined clearance from each other so as to be electric-field coupled or magnetic-field coupled with one after another.

11. The bandpass filter according to claim 10, wherein the two or more transmission line resonators are three or more transmission line resonators, with each of the first transmission line, the second transmission line and the third transmission line being disposed so as to have a loop shape, and a desired two transmission line resonators among the three or more transmission line resonators are mutually electric-field coupled or magnetic-field coupled with each other.

12. A multiplexer comprising:

two or more bandpass filters, each of which is formed by allowing two or more transmission line resonators that each have features according to the transmission line resonator of claim 1, having the same resonance frequency to be disposed so as to be adjacent to each other with a predetermined clearance from each other so as to be electric-field coupled or magnetic-field coupled with each other;

an input terminal that is formed by allowing respective inputs of the two or more bandpass filters to be electric-field coupled or magnetic-field coupled with each other; and an output terminal that is electric-field coupled or magnetic-field coupled with one of the two or more transmission line resonators other than the transmission line resonators having the input terminals of the two or more bandpass filters, wherein the two or more bandpass filters have respectively different passing bands.

13. A balanced-to-unbalanced transformer comprising:

a first transmission line having a first line impedance and a first line length;

a second transmission line having a second line impedance and a second line length, with one end being connected to one end of the first transmission line and the other end being short-circuited to ground;

a third transmission line having the second line impedance and the second line length, with one end being connected to the other end of the first transmission line and the other end being short-circuited to ground;

a capacitive element, with one end being connected to a center portion of the first transmission line and the other end being short-circuited to ground;

a first input terminal and a second input terminal that are respectively magnetic-field coupled to a vicinity of a short-circuit grounding unit between the second transmission line and the third transmission line; and an output terminal electric-field coupled to a vicinity of a center portion of the first transmission line, wherein the first transmission line, the second transmission line and the third transmission line are disposed in a loop shape, and wherein the capacitive element satisfies the following formulas:

$$B = \frac{2 \cdot (R_Z - \tan\theta_1 \cdot \tan\theta_2)}{Z_1 \cdot (\tan\theta_2 + R_Z \cdot \tan\theta_1)} \quad \text{[Formula 1]}$$

$$R_Z = \frac{Z_1}{Z_2} \quad \text{[Formula 2]}$$

where jB represents an admittance of the capacitive element, $Z_1$ represents the first line impedance, $2\theta_1$ represents the first line length, $Z_2$ represents the second line impedance, and $\theta_2$ represents the second line length.

14. A power divider comprising:

a first transmission line having a first line impedance and a first line length;

a second transmission line having a second line impedance and a second line length, with one end being connected to one end of the first transmission line and the other end being short-circuited to ground;

a third transmission line having the second line impedance and the second line length, with one end being connected to the other end of the first transmission line and the other end being short-circuited to ground;

a capacitive element, with one end being connected to a center portion of the first transmission line and the other end being short-circuited to ground;

an input terminal that is electric-field coupled to a vicinity of a center portion of the first transmission line; and a first output terminal and a second output terminal that are respectively magnetic-field coupled to a vicinity of a short-circuit grounding unit between the second transmission line and the third transmission line, wherein the first transmission line, the second transmission line and the third transmission line are disposed in a loop shape, and wherein the capacitive element satisfies the following formulas:

$$B = \frac{2 \cdot (R_Z - \tan\theta_1 \cdot \tan\theta_2)}{Z_1 \cdot (\tan\theta_2 + R_Z \cdot \tan\theta_1)} \quad \text{[Formula 1]}$$

$$R_Z = \frac{Z_1}{Z_2} \quad \text{[Formula 2]}$$

where jB represents an admittance of the capacitive element, $Z_1$ represents the first line impedance, $2\theta_1$ represents the first line length, $Z_2$ represents the second line impedance, and $\theta_2$ represents the second line length.

15. An unbalanced-to-balanced transformer comprising:
- a first transmission line having a first line impedance and a first line length;
- a second transmission line having a second line impedance and a second line length, with one end being connected to one end of the first transmission line and the other end being short-circuited to ground;
- a third transmission line having the second line impedance and the second line length, with one end being connected to the other end of the first transmission line and the other end being short-circuited to ground;
- a capacitive element, with one end being connected to a center portion of the first transmission line and the other end being short-circuited to ground;
- an input terminal that is electric-field coupled to a vicinity of a center portion of the first transmission line;
- a first phase adjusting unit and a second phase adjusting unit having virtually the same line length, which are disposed so as to be adjacent to each other with a predetermined clearance from each other, respectively in parallel with the second transmission line and the third transmission line;
- a first output terminal that is magnetic-field coupled to one end of the first phase adjusting unit, which is located at a position farthest from a short-circuit grounding unit of the second transmission line; and
- a second output terminal that is magnetic-field coupled to one end of the second phase adjusting unit, which is located at a position closest to a short-circuit grounding unit of the third transmission line,
- wherein the first transmission line, the second transmission line and the third transmission line are disposed in a loop shape, with the other end of each of the first phase adjusting unit and the second phase adjusting unit being short-circuited to ground.

16. A frequency mixer comprising:
- an unbalanced-to-balanced transformer according to claim 15;
- a high frequency signal input unit having a high frequency signal input terminal for use in inputting a high frequency signal and a high frequency signal output terminal for use in outputting a signal that has been subjected to a predetermined filtering treatment;
- a high frequency mixing unit having a first mixing unit input terminal and a second mixing unit input terminal that are respectively coupled to the first output terminal and the second output terminal of the unbalanced-to-balanced transformer, a third mixing unit input terminal that is coupled to the high frequency signal output terminal of the high frequency signal input unit and a mixing unit output terminal that detects the high frequency signal and the local oscillation signal and outputs a mixed signal; and
- an intermediate frequency signal output unit having an intermediate frequency input terminal coupled to the mixing unit output terminal, which outputs an intermediate frequency signal that has been subjected to a predetermined filtering treatment,
- wherein the input terminal of the unbalanced-to-balanced transformer is used for inputting a local oscillation signal.

17. The frequency mixer according to claim 16, wherein the high frequency signal input unit is a high bandpass filter, and the high frequency signal input unit has the first mixing unit input terminal thereof connected to an anode of a first diode and the second mixing unit input terminal thereof connected to a cathode of a second diode, with a cathode of the first diode and an anode of the second diode being respectively connected to the third mixing unit input terminal and mixing unit output terminal.

18. The frequency mixer according to claim 16, wherein the high frequency signal input unit is an unbalanced-to-balanced transformer having a passing frequency that is different from that of the unbalanced-to-balanced transformer, and the high frequency mixing unit further comprises:
- a fourth mixing unit input terminal that is different from the third mixing unit input terminal and coupled to one of the two high frequency signal output terminals of the high frequency signal input unit that outputs a balanced signal, and
- wherein the high frequency mixing unit has the first mixing unit input terminal thereof connected to an anode of a first diode and a cathode of a second diode, the second mixing unit input terminal thereof connected to an anode of a third diode and a cathode of a fourth diode, the third mixing unit input terminal thereof connected to an anode of the second diode and a cathode of the third diode, and the fourth mixing unit input terminal thereof connected to a cathode of the first diode, an anode of the fourth diode and the mixing unit output terminal.

19. A bandpass filter with a balanced input and an unbalanced output comprising:
- one or more sets of transmission line resonators, each having a first transmission line having a first line impedance and a first line length;
- a second transmission line having a second line impedance and a second line length, with one end being connected to one end of the first transmission line and the other end being short-circuited to ground;
- a third transmission line having the second line impedance and the second line length, with one end being connected to the other end of the first transmission line and the other end being short-circuited to ground; and
- a capacitive element, with one end being connected to a center portion of the first transmission line and the other end being short-circuited to ground,
- wherein each of the one or more sets of transmission line resonators has a structure in which the first transmission line, the second transmission line and the third transmission line are formed by disposing the respective first transmission lines of two transmission line resonators having the same resonance frequency, disposed in a loop shape, so as to be adjacent to each other virtually in parallel with each other with a predetermined clearance from each other, and the plural sets of the transmission line resonators are disposed so as to be adjacent to each other with a predetermined clearance from each other in parallel with each of the second transmission line or the third transmission line, and longitudinally connected to one another successively by magnetic-field coupling,
- wherein first and second input terminals are respectively magnetic-field coupled to a vicinity of a short-circuit grounding unit between the second transmission line and the third transmission line of a top transmission line resonator,
- wherein an output terminal is electric-field coupled to a center portion of the first transmission line of the last transmission line resonator having a second transmission line and a third transmission line that are disposed so as to be adjacent in parallel with each other with a predetermined clearance from each other, and wherein the capacitive element satisfies the following formulas:

$$B = \frac{2 \cdot (R_Z - \tan\theta_1 \cdot \tan\theta_2)}{Z_1 \cdot (\tan\theta_2 + R_Z \cdot \tan\theta_1)} \quad \text{[Formula 1]}$$

$$R_Z = \frac{Z_1}{Z_2} \quad \text{[Formula 2]}$$

where jB represents an admittance of the capacitive element, $Z_1$ represents the first line impedance, $2\theta_1$ represents the first line length, $Z_2$ represents the second line impedance, and $\theta_2$ represents the second line length.

20. The bandpass filter according to claim 19, wherein only one set of the one or more sets of transmission line resonators is installed within the bandpass filter.

21. A balance-type filter comprising:
one or more sets of transmission line resonators, each having a first transmission line having a first line impedance and a first line length; a second transmission line having a second line impedance and a second line length, with one end being connected to one end of the first transmission line and the other end being short-circuited to ground; a third transmission line having the second line impedance and the second line length, with one end being connected to the other end of the first transmission line and the other end being short-circuited to ground; and a capacitive element, with one end being connected to a center portion of the first transmission line and the other end being short-circuited to ground,
wherein each set of the transmission line resonators is formed by disposing respective first transmission lines of two of the one or more sets of transmission line resonators having the same resonance frequency, with the first, second and third transmission lines being disposed in a loop shape, so as to be adjacent virtually in parallel with each other with a predetermined clearance from each other, and the one or more sets of the transmission line resonators are disposed so as to be adjacent to each other with a predetermined clearance from each other in parallel with each of the second transmission line or the third transmission line, and longitudinally connected to one another successively by magnetic-field coupling with each other, and
wherein first and second input terminals are respectively magnetic-field coupled to a vicinity of a short-circuit grounding unit between the second transmission line and the third transmission line of a top transmission line resonator of the one or more sets of transmission line resonators, and a first phase adjusting unit and a second phase adjusting unit having the virtually the same line length are disposed adjacent to each other with a predetermined clearance virtually in parallel with the second transmission line and the third transmission line of the last transmission line resonator of the one or more sets of transmission line resonators, and
wherein a first output terminal that is magnetic-field coupled to one of ends of the first phase adjusting unit located at a position farthest from the portion that is short-circuited to ground of the second transmission line and a second output terminal that is magnetic-field coupled to one of ends of the second phase adjusting unit located at a position closest to the portion that is short-circuited to ground of the third transmission line are prepared, with the other ends of the first phase adjusting unit and the second phase adjusting unit being short-circuited to ground.

22. The balance-type filter according to claim 21, wherein only one of the one or more sets of transmission line resonators is installed within the balance-type filter.

* * * * *